US006987690B2

(12) United States Patent
Hidaka

(10) Patent No.: US 6,987,690 B2
(45) Date of Patent: Jan. 17, 2006

(54) THIN FILM MAGNETIC MEMORY DEVICE FOR PROGRAMMING REQUIRED INFORMATION WITH AN ELEMENT SIMILAR TO A MEMORY CELL AND INFORMATION PROGRAMMING METHOD

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 115 days.

(21) Appl. No.: 10/691,513

(22) Filed: Oct. 24, 2003

(65) Prior Publication Data

US 2004/0090856 A1 May 13, 2004

Related U.S. Application Data

(63) Continuation of application No. 10/234,243, filed on Sep. 5, 2002, now Pat. No. 6,683,807.

(30) Foreign Application Priority Data

Nov. 14, 2001 (JP) .......................... 2001-348800
Mar. 15, 2002 (JP) .......................... 2002-072088

(51) Int. Cl.
*G11C 11/44* (2006.01)

(52) U.S. Cl. ........................ 365/161; 365/171
(58) Field of Classification Search ................ 365/161, 365/171, 50, 55, 66
See application file for complete search history.

(56) References Cited

U.S. PATENT DOCUMENTS

| | | | |
|---|---|---|---|
| 5,751,627 A | 5/1998 | Ooishi | |
| 6,324,093 B1 * | 11/2001 | Perner et al. | ............... 365/171 |
| 6,331,943 B1 * | 12/2001 | Naji et al. | .................. 365/158 |
| 6,343,032 B1 | 1/2002 | Black et al. | |
| 6,646,911 B2 | 11/2003 | Hidaka | |
| 2002/0009003 A1 | 1/2002 | Hartmann | |
| 2002/0057594 A1 | 5/2002 | Hiral | |

FOREIGN PATENT DOCUMENTS

| | | |
|---|---|---|
| DE | 100 34062 A1 | 1/2002 |
| DE | 102 28 560 A1 | 5/2003 |
| EP | 1 189 239 A2 | 9/2001 |
| WO | WO 01/54279 A1 | 7/2001 |
| WO | WO 99/1 253 651 A2 | 10/2002 |

OTHER PUBLICATIONS

"A 10 ns Read and Write Non–Volatile Memory Array Using a Magnetic Tunnel Junction and FET Switch in Each Cell", Scheuerlein et al., ISSCC Digest of Technical Papers, TA7.2, Feb. 2000, pp. 94–95, 128–129, 409–410.
"Nonvolatile RAM based on Magnetic Tunnel Junction Elements", Durlam et al., ISSCC Digest of Technical Papers, TA7.3, Feb. 2000, pp. 96–97, 130–131, 410–411.
A 256kb 3.0V 1T1MTJ Nonvolatile Magnetoresistive RAM, Naji et al., ISSCC Digest of Technical Papers, TA7.6, Feb. 2001, pp. 94–95, 122–123, 404–405, 438.
Durlam, M., et al., "Nonvolatile RAM based on magnetic tunnel junction elements" IEEE International Solid–State Circuits Conference, Feb. –9, 2000, pp. 130–131.

(Continued)

*Primary Examiner*—Thong Le
(74) *Attorney, Agent, or Firm*—McDermott Will & Emery LLP

(57) ABSTRACT

A program unit includes two program cells having an electric resistance varying according to a magnetization direction thereof. These program cells are magnetized in the same direction in initial state, that is, non-program state. In program state, the magnetization direction of one of the program cells selected according to program data is changed from the initial state. One-bit program data and information of whether the program unit stores program data or not can be read based on two program signals generated according to the electric resistances of the two program cells.

24 Claims, 26 Drawing Sheets

OTHER PUBLICATIONS

Scheuerlein, R., et al., "A 10ns read and write non-volatile memory array using a magnetic tunhnel junction and FET switch in each cell" IEEE International Solid-State Circuits Conference, Feb. 7-9, 2000, pp. 128-129.

Naji, P., et al., "A 256kb 3.0V 1T1MTJ nonvolatile magnetoresistive RAM" IEEE International Solid-State Circuits Conference, Feb. 7-9, 2001, pp. 122-123, 438.

Wee, J., et al., "An antifuse EPROM circuitry scheme for field-programmable repair in DRAM" IEEE Journal of Solid-State Circuits, vol. 35, No. 10, Oct. 2000, pp. 1408-1414.

Black, W., et al., "Programmable logic using giant-magnetoresistance and spin-dependent tunneling devices (invited)" Journal of Applied Physics, vol. 87, No. 9, May 2000, pp. 6647-6679.

* cited by examiner (PORTION CORRESPONDING TO FAD1)

|  | INITIAL STATE | PROGRAM STATE 1 | PROGRAM STATE 2 | NON-PROGRAM STATE |
|---|---|---|---|---|
| PRC1(R1) | Rmin | Rmin | Rmax | (SAME AS INITIAL STATE) |
| PRC2(R2) | Rmin | Rmax | Rmin | (SAME AS INITIAL STATE) |
| OUTPUT φa | "L" | "H" | "H" | (SAME AS INITIAL STATE) |
| OUTPUT φb | "H" | "L" | "H" | (SAME AS INITIAL STATE) |

PROGRAM DATA READ OPERATION (INITIAL STATE: NON-PROGRAM STATE)

PROGRAM DATA WRITE OPERATION

PROGRAM DATA READ OPERATION (PROGRAM STATE)

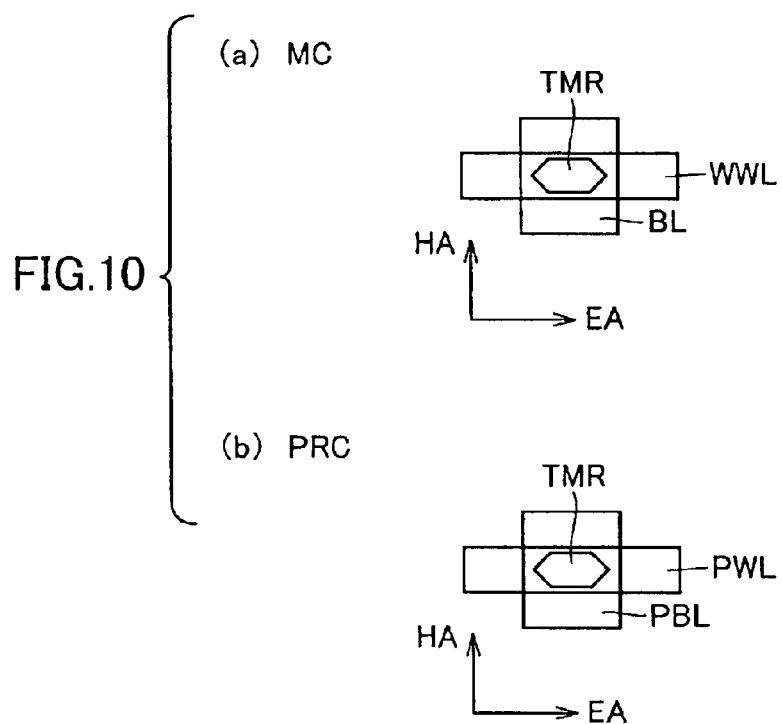

|  | INITIAL STATE | PROGRAM STATE 1 | PROGRAM STATE 2 | NON-PROGRAM STATE |
|---|---|---|---|---|
| PDj | — | "L" | "H" | — |
| PRG | — | "H" | "H" | "L" |
| PRC1(R1) | Rmin | Rmin | Rmax | (SAME AS INITIAL STATE) |
| PRC2(R2) | Rmin | Rmax | Rmin | (SAME AS INITIAL STATE) |
| OUTPUT φa | "L" | "H" | "H" | (SAME AS INITIAL STATE) |
| OUTPUT φb | "H" | "L" | "H" | (SAME AS INITIAL STATE) |

|  | INITIAL STATE | PROGRAM STATE 1 | PROGRAM STATE 2 | NON-PROGRAM STATE |
|---|---|---|---|---|
| PRC1(R1) | Rmax,Rmin | Rmin,Rmax | Rmin,Rmax | (SAME AS INITIAL STATE) |
| PRC2(R2) | Rmin,Rmin | Rmax,Rmin | Rmin,Rmax | (SAME AS INITIAL STATE) |
| OUTPUT φa | "L" | "H" | "H" | (SAME AS INITIAL STATE) |
| OUTPUT φb | – (INDETERMINATE) | "L" | "H" | (SAME AS INITIAL STATE) |

THIN FILM MAGNETIC MEMORY DEVICE FOR PROGRAMMING REQUIRED INFORMATION WITH AN ELEMENT SIMILAR TO A MEMORY CELL AND INFORMATION PROGRAMMING METHOD

This application is a continuation of application Ser. No. 10/234,243 filed Sep. 05, 2002, now U.S. Pat. No. 6,683,807.

BACKGROUND OF THE INVENTION

1. Field of the Invention

The present invention generally relates to a thin film magnetic memory device. More particularly, the present invention relates to a random access memory (RAM) including memory cells having a magnetic tunnel junction (MTJ), and an information programming method.

2. Description of the Background Art

An MRAM Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 31 schematically shows the structure of a memory cell having a magnetic tunnel junction (hereinafter, sometimes simply referred to as "MTJ memory cell").

Referring to FIG. 31, the MTJ memory cell includes a tunneling magneto-resistance element TMR having an electric resistance varying according to the storage data level, and an access element ATR for forming a path of a sense current Is flowing through tunneling magneto-resistance element TMR in data read operation. Since a field effect transistor is typically used as access element ATR, access element ATR is hereinafter sometimes referred to as access transistor ATR. Access transistor ATR is coupled between tunneling magneto-resistance element TMR and a fixed voltage (ground voltage Vss).

A write word line WWL for data write operation, a read word line RWL for data read operation, and a bit line BL are provided for the MTJ memory cell. Bit line BL is a data line for transmitting an electric signal corresponding to the storage data level in data read operation and data write operation.

FIG. 32 is a conceptual diagram illustrating data read operation from the MTJ memory cell.

Referring to FIG. 32, tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction according to an external magnetic field (hereinafter, sometimes simply referred to as "free magnetic layer"). A tunneling barrier (tunneling film) TB is interposed between fixed magnetic layer FL and free magnetic layer VL. Tunneling barrier TB is formed from an insulator film. Free magnetic layer VL is magnetized either in the same direction as, or in the opposite direction to, that of fixed magnetic layer FL according to the storage data level. Fixed magnetic layer FL, tunneling barrier TB and free magnetic layer VL form a magnetic tunnel junction.

In data read operation, access transistor ATR is turned ON in response to activation of read word line RWL. This allows a sense current Is to flow through a current path formed by bit line BL, tunneling magneto-resistance element TMR, access transistor ATR and ground voltage Vss.

The electric resistance of tunneling magneto-resistance element TMR varies according to the relation between the magnetization directions of fixed magnetic layer FL and free magnetic layer VL. More specifically, when fixed magnetic layer FL and free magnetic layer VL have the same (parallel) magnetization direction, tunneling magneto-resistance element TMR has a smaller electric resistance than when they have opposite (antiparallel) magnetization directions.

Accordingly, when free magnetic layer VL is magnetized in one of the above two directions according to the storage data level, a voltage change produced in tunneling magneto-resistance element TMR by sense current Is varies depending on the storage data level. Therefore, by precharging bit lines BL to a prescribed voltage and then applying sense current Is to tunneling magneto-resistance element TMR, the storage data of the MTJ memory cell can be read by sensing the voltage on bit line BL.

FIG. 33 is a conceptual diagram illustrating data write operation to the MTJ memory cell.

Referring to FIG. 33, in data write operation, read word line RWL is inactivated and access transistor ATR is turned OFF. In this state, a data write current is applied to write word line WWL and bit line BL in order to magnetize free magnetic layer VL in the direction according to the write data level. The magnetization direction of free magnetic layer VL is determined by the directions of the data write currents flowing through write word line WWL and bit line BL.

FIG. 34 is a conceptual diagram illustrating the relation between the data write current and the magnetization direction of tunneling magneto-resistance element TMR in data write operation to the MTJ memory cell.

Referring to FIG. 34, the abscissa H(EA) indicates a magnetic field that is applied to free magnetic layer VL of tunneling magneto-resistance element TMR in the easy-axis (EA) direction. The ordinate H(HA) indicates a magnetic field that is applied to free magnetic layer VL in the hard-axis (HA) direction. Magnetic fields H(EA), H(HA) respectively correspond to two magnetic fields generated by the currents flowing through bit line BL and write word line WWL.

In the MTJ memory cell, fixed magnetic layer FL is magnetized in the fixed direction along the easy axis of free magnetic layer VL. Free magnetic layer VL is magnetized either in the direction parallel (the same as) or antiparallel (opposite) to that of fixed magnetic layer FL along the easy axis according to the storage data level ("1" and "0"). Hereinafter, Rmax and Rmin (where Rmax>Rmin) denote the electric resistances of tunneling magneto-resistance element TMR corresponding to the two magnetization directions of free magnetic layer VL. The MTJ memory cell is thus capable of storing one-bit data ("1" and "0") according to the two magnetization directions of free magnetic layer VL.

The magnetization direction of free magnetic layer VL can be rewritten only when the sum of the applied magnetic fields H(EA) and H(HA) reaches the region outside the asteroid characteristic line in FIG. 34. In other words, the magnetization direction of free magnetic layer VL will not change if an applied data write magnetic field corresponds to the region inside the asteroid characteristic line.

As shown by the asteroid characteristic line, applying a magnetic field of the hard-axis direction to free magnetic layer VL reduces a magnetization threshold value required to change the magnetization direction along the easy axis.

When the write operation point is designed as in the example of FIG. 34, a data write magnetic field of the easy-axis direction is designed to have strength $H_{WR}$ in the MTJ memory cell to be written. In other words, a data write current to be applied to bit line BL or write word line WWL is designed to generate a data write magnetic field $H_{WR}$. Data write magnetic field $H_{WR}$ is commonly defined by the sum of a switching magnetic field $H_{SW}$ required to switch the magnetization direction and a margin $\Delta H$. Data write magnetic field $H_{WR}$ is thus defined by $H_{WR}=H_{SW}+\Delta H$.

In order to rewrite the storage data of the MTJ memory cell, that is, the magnetization direction of tunneling magneto-resistance element TMR, a data write current of at least a prescribed level must be applied to both write word line WWL and bit line BL. Free magnetic layer VL in tunneling magneto-resistance element TMR is thus magnetized in the direction parallel (the same as) or antiparallel (opposite) to that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another data write operation is conducted.

A memory device commonly conducts normal operation such as data read operation and data write operation based on program information stored therein in a non-volatile manner. Typically, information for use in control of the redundant structure (the structure for replacing a defective memory cell with a spare memory cell) is stored as program information. In the redundant structure, at least defective addresses for specifying defective memory cells must be stored as program information.

In the conventional memory device, program information is programmed by blowing fuse elements with laser or the like. However, this requires special equipments such as a trimming device for laser blowing, thereby increasing the time and costs required for the programming operation.

Such programming operation is conducted at wafer level. Therefore, if defective memory cells are detected at wafer level and defective addresses corresponding to the detected defective memory cells are programmed in the memory device before packaging process, it is difficult to handle defects generated after the packaging process, resulting in reduction in yield.

The above MTJ memory cells are capable of non-volatile data storage. Therefore, in the MRAM device, required information may be programmed with magnetic memory elements that are the same as, or similar to, the MTJ memory cells used as normal memory cells.

However, this structure requires frequent reset operation unless the initial state and program state of the magnetic memory elements used for the programming operation are clearly defined. This may possibly hinder high-speed operation of the memory device. Moreover, a current must be supplied to the magnetic memory elements in order to read the programmed information therefrom. Therefore, regarding operation of reading the program information, the program elements must have as high operation reliability as the normal memory cells.

SUMMARY OF THE INVENTION

It is an object of the present invention to provide a thin film magnetic memory device capable of efficiently programming required information by using magnetic memory elements similar to normal memory cells.

In summary, according to one aspect of the present invention, a thin film magnetic memory device includes a memory array and a program circuit. The memory array has a plurality of memory cells arranged in a matrix, for magnetically storing data. Each memory cell has a magnetic storage portion for storing data when being magnetized in one of two directions. The program circuit stores information for use in at least one of data read operation and data write operation from and to the plurality of memory cells. The program circuit includes a plurality of program units for storing program data of the information when the program unit is in a program state. Each program unit includes two program cells that are magnetized in one of two directions. When the program unit is in the program state, one of the two program cells in the program unit is magnetized in a direction different from that in a non-program state.

Accordingly, a main advantage of the present invention is that each program unit is capable of magnetically storing program data and information of whether the program unit stores program data or not. This enables the initial state and the program state of each program unit to be recognized clearly. As a result, program data can be stored in a non-volatile manner, and can be read at any time without conducting reset operation.

According to another aspect of the present invention, a thin film magnetic memory device includes a memory array and a program circuit. The memory array has a plurality of memory cells for magnetically storing data. Each memory cell has a magnetic storage portion for storing data when being magnetized in one of two directions. The program circuit stores information for use in operation of the thin film magnetic memory device. The program circuit includes a program element for magnetically storing program data of the information, a sensing circuit for reading the program data from the program element in response to power-ON of the thin film magnetic memory device, and a data latch circuit for holding the program data read by said sensing circuit until power-OFF.

In the above thin film magnetic memory device, even when information that must be frequently referred to in operation is programmed in the program circuit, program data need only be read only upon power-ON. This suppresses a current stress applied to the program cells and thus improves operation reliability of the program cells, i.e., magnetic cells.

According to still another aspect of the present invention, a thin film magnetic memory device includes a memory array and a plurality of program registers. The memory array has a plurality of memory cells for magnetically storing one-bit data. Each memory cell has a magneto-resistance element whose electric resistance varies when the magneto-resistance element is magnetized in a direction according to the data. Each of the plurality of program registers stores a one-bit program signal for use in programming of information used in operation of the thin film magnetic memory device. Each program register includes a plurality of program elements each having an electric resistance varying according to a magnetization direction thereof, and a sensing circuit for reading a corresponding one-bit program signal according to a difference in electric resistance between the plurality of program elements. The number of program elements included in each program register is greater than that of magneto-resistance elements used in each memory cell to store one-bit data.

In the above thin film magnetic memory device, each program register as a unit for storing a one-bit program signal has higher reliability than that of the memory cell for normal data storage. As a result, the program units will not malfunction as long as the memory cells operate properly, whereby stable operation of the MRAM device will be assured.

According to yet another aspect of the present invention, a thin film magnetic memory device includes a memory array and a plurality of program registers. The memory array has a plurality of memory cells for magnetically storing data. Each memory cell includes a magneto-resistance element having either a first electric resistance or a second electric resistance higher than the first electric resistance when being magnetized in a direction according to the data. Each of the plurality of program registers stores a one-bit program signal for use in programming of information used in operation of the thin film magnetic memory device. Each program register includes a plurality of program elements each having an electric resistance varying according to a magnetization direction thereof. Each program element has either a third electric resistance lower than the first electric resistance or a fourth electric resistance higher than the third electric resistance according to the one-bit program signal stored therein. A ratio between the first and second electric resistances is equal to that between the third and fourth electric resistances.

In the above thin film magnetic memory device, even when the same bias voltage is applied across both ends of the program cell and the memory cell, the difference in current between the storage data levels is greater in the program cell than in the memory cell. Accordingly, the program cells have a greater read operation margin than that of the memory cells, whereby the program registers have higher reliability than that of the memory cells for normal data storage. As a result, the program units will not malfunction as long as the memory cells operate properly, whereby stable operation of the MRAM device will be assured.

According to a further aspect of the present invention, a thin film magnetic memory device includes a memory array and a plurality of program registers. The memory array has a plurality of memory cells for magnetically storing data. Each memory cell includes a magnetic storage portion for storing data when being magnetized in one of two directions. Each of the plurality of program registers stores a one-bit program signal for use in programming of information used in operation of the thin film magnetic memory device. Each program register includes at least one program element having an electric resistance varying according to a magnetization direction thereof, The electric resistance of the program element is capable of being fixed with physical breakdown operation.

In the above thin film magnetic memory device, the program element stores program information, and the storage data in each program element is magnetically rewritable. The storage data in each program element can be irreversibly fixed with physical breakdown operation. As a result, program information can be prevented from being written to the program elements later by accident.

According to a still further aspect of the present invention, a thin film magnetic memory device includes a memory array and a plurality of program registers. The memory array has a plurality of memory cells for magnetically storing data. Each memory cell includes a magnetic storage portion for storing data when being magnetized in one of two directions. Each of the plurality of program registers stores a one-bit program signal for use in programming of information used in operation of the thin film magnetic memory device. Each program register includes program elements each having either a first or second electric resistance according to a magnetization direction thereof, a comparative resistor portion having an intermediate electric resistance of the first and second electric resistances, and a sensing circuit for reading a corresponding one-bit program signal based on comparison between electric resistances of the program element and the comparative resistor portion. Either a first or second locking operation is capable of being selectively conducted. The first locking operation is an operation for irreversibly fixing the electric resistance of the program element to a third electric resistance that falls within a range other than that between first and second electric resistances by physical breakdown operation of the program register. The second locking operation is an operation for irreversibly fixing the electric resistance of the comparative resistor portion to a fourth electric resistance that falls within a range other than that between the first and second electric resistances by physical breakdown operation of the comparative resistor portion.

In the above thin film magnetic memory device, a one-bit program signal can be held in each program register according to the magnetization direction of the program element, and the storage data in the program register can be irreversibly fixed. This prevents the fixed storage data in the program register from being rewritten later by accident.

According to a yet further aspect of the present invention, a method for programming information in a thin film magnetic memory device including a plurality of memory cells for magnetically storing data includes a first program step of storing information for use in operation to a program circuit, and a second program step of rewriting the information stored in the program circuit. The first program step is conducted between a wafer fabrication step and a packaging step. The second program step is conducted after the packaging step. The program circuit includes a plurality of program registers each storing a one-bit program signal for use in programming of the information in each of the first and second program steps. Each program register has at least one program element having an electric resistance according to a magnetization direction.

In the above information programming method, a one-bit program signal can be held in each program register according to the magnetization direction of the program element. As a result, information reflecting the result of operation test and the like can be programmed in the thin film magnetic memory device by using the program steps conducted before and after the packaging step.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a conceptual diagram illustrating the arrangement of a program cell.

FIG. 23 is a circuit diagram showing an example of the structure of a program unit according to a sixth embodiment of the present invention.

FIG. 24 shows the relation between the electric resistance of program cells in the program unit of FIG. 23, the state of the program unit and the like.

DESCRIPTION OF THE PREFERRED EMBODIMENTS

Hereinafter, embodiments of the present invention will be described in detail with reference to the accompanying drawings.

First Embodiment

Figure 1:
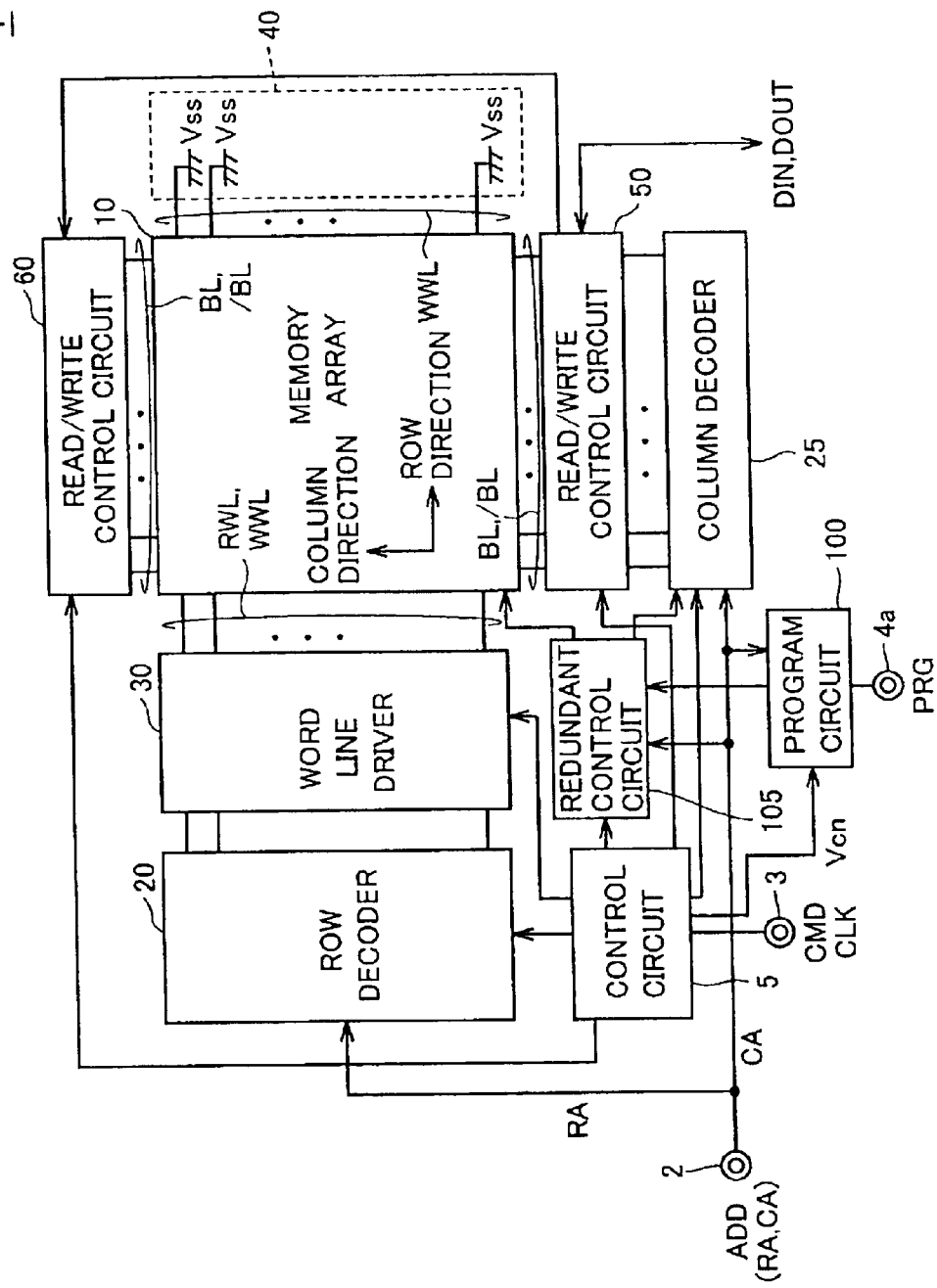
FIG. 1 is a schematic block diagram of the overall structure of an MRAM device 1 according to the present invention.

Referring to FIG. 1, an MRAM device according to an embodiment of the present invention conducts random access according to an external control signal CMD and an external address signal ADD in order to receive write data DIN and output read data DOUT. Data read operation and data write operation in MRAM device 1 are conducted in synchronization with, e.g., an external clock signal CLK. Alternatively, the operation timing may be determined internally without receiving external clock signal CLK.

MRAM device 1 includes an address terminal 2 for receiving an address signal ADD, a control signal terminal 3 for receiving a control signal CMD and a clock signal CLK, a signal terminal 4a for receiving a program signal PRG that is activated in the programming operation, a control circuit 5 for controlling the overall operation of MRAM device 1 in response to control signal CMD and clock signal CLK, and a memory array 10 having a plurality of MTJ memory cells arranged in a matrix.

Although specifically described later, memory array 10 includes a plurality of normal MTJ memory cells (hereinafter, sometimes referred to as "normal memory cells") arranged in a matrix, and spare memory cells (not shown) for replacing a defective normal memory cell (hereinafter, sometimes referred to as "defective memory cell"). The normal MTJ memory cells and the spare memory cells can be designated by address signal ADD.

Redundant replacement of the normal memory cells is conducted on a block-by-block basis. The spare memory cells form a plurality of redundant circuits (not shown) for replacing a block including a defective memory cell. Each memory cell row, each memory cell column or each data input/output (I/O) line may be used as a block for redundant replacement. In other words, redundant replacement may be conducted on a row-by-row basis, a column-by-column basis, or a data I/O line-by data I/O line basis. In this case, each redundant circuit corresponds to a spare block corresponding to a spare row, a spare column or a spare I/O line. As specifically described later, in the present embodiment, it is assumed that redundant replacement of the normal memory cells is conducted on a column-by-column basis.

A plurality of write word lines WWL and a plurality of read word lines RWL are provided corresponding to the MTJ memory cell rows (hereinafter, sometimes simply referred to as "memory cell rows"). Bit lines BL, /BL are provided corresponding to the MTJ memory cell columns (hereinafter, sometimes simply referred to as "memory cell columns").

MRAM device 1 further includes a row decoder 20, a column decoder 25, a word line driver 30, and read/write control circuits 50, 60.

Row decoder 20 selects a row in memory array 10 according to a row address RA of address signal ADD. Column decoder 25 selects a column in memory array 10 according to a column address CA of address signal ADD. Word line driver 30 selectively activates read word line RWL or write word line WWL based on the row selection result of row decoder 20. Row address RA and column address CA specify a memory cell designated for data read operation or data write operation (hereinafter, sometimes referred to as "selected memory cell").

Write word lines WWL are coupled to a ground voltage Vss in a region 40 that faces word line driver 30 with memory array 10 interposed therebetween. Read/write control circuit 50, 60 collectively refers to a circuit group that is provided in a region adjacent to memory array 10 in order to supply a data write current and a sense current (data read current) to bit lines BL, /BL of a selected memory cell column corresponding to a selected memory cell (hereinafter, sometimes simply referred to as "selected column").

MRAM device 1 further includes a program circuit 100 and a redundant control circuit 105.

Program circuit 100 stores program information used in at least one of data read operation and data write operation in a non-volatile manner. In program data write operation, a program signal PRG is activated, and program circuit 100 receives program data of the program information from the outside through, e.g., address terminal 2. Program data read operation is conducted according to a control voltage Vcn from control circuit 5.

Hereinafter, the structure for storing defective addresses (addresses for specifying defective memory cells) in program circuit 100 as program information will be exemplarily described. A defective address corresponds to a column address designating a memory cell column on which a defective memory cell is present (hereinafter, sometimes referred to as "defective column").

In normal operation, redundant control circuit 105 compares column address CA with the defective addresses retained in program circuit 100, and determines whether or not a defective column is selected for data read operation or data write operation, based on the comparison result.

When a defective column is selected by column address CA, redundant control circuit 105 provides an instruction to access a redundant circuit formed by spare memory cells, and also instructs column decoder 25 to stop accessing to the memory cell column designated by column address CA. Data is thus read from or written to the redundant circuit instead of the memory cell column designated by column address CA.

If column address CA does not correspond to any defective address, column decoder 25 conducts normal column selection operation. More specifically, column decoder 25 selects a memory cell column designated by column address CA, and data read operation or data write operation is conducted.

Hereinafter, the redundant structure in MRAM device 1 will be described.

Figure 2:
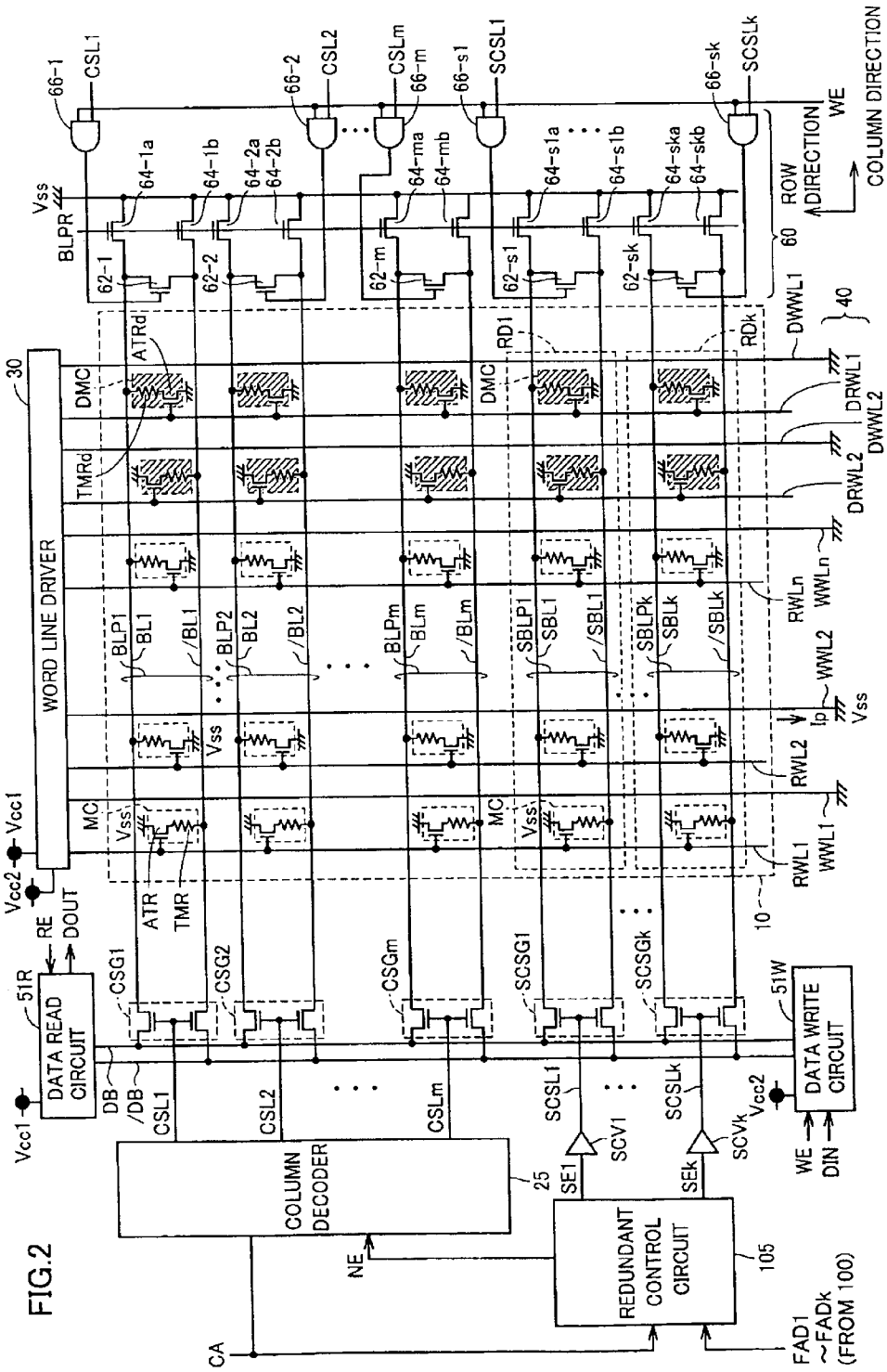
FIG. 2 is a circuit diagram showing the structure of a memory array in FIG. 1.

Referring to FIG. 2, memory array 10 includes normal memory cells MC arranged in n rows by m columns (where n, m is a natural number), and k redundant circuits RD1 to RDk (where k is a natural number). In the present embodiment, redundant replacement is conducted on a column-by-column basis. Therefore, redundant circuits RD1 to RDk correspond to spare columns. Note that, hereinafter, redundant circuits RD1 to RDk are sometimes generally referred to as redundant circuits RD.

In the entire memory array 10, MTJ memory cells having the same structure are arranged in n rows by (m+k) columns. Note that, hereinafter, the memory cell columns of the normal memory cells are sometimes referred to as "normal memory cell columns", and the memory cell columns of the spare memory cells corresponding to redundant circuits RD1 to RDk are sometimes referred to as "spare memory cell columns".

Read word lines RWL1 to RWLn and write word lines WWL1 to WWLn are provided corresponding to the memory cell rows. Bit line pairs BLP1 to BLPm are provided corresponding to the normal memory cell columns. Each bit line pair is comprised of two complementary bit lines. For example, a bit line pair BLP1 is comprised of bit lines BL1, /BL1.

Spare bit line pairs SBLP1 to SBLPk are provided corresponding to the spare memory cell columns. Like the bit line pairs, each spare bit line pair is comprised of two complementary bit lines. For example, a spare bit line pair SBLP1 is comprised of spare bit lines SBL1, /SBL1.

Hereinafter, write word lines, read word lines, bit line pairs, bit lines, spare bit line pairs, and spare bit lines are generally denoted with WWL, RWL, BLP, BL (/BL), SBLP, and SBL (/SBL), and a specific write word line, read word line, bit line pair, bit line, spare bit line pair, and spare bit line are denoted with WWL1, RWL1, BLP1, BL1 (/BL1), SBLP1, SBL1 (/SBL1) and the like. The high-voltage state (power supply voltages Vcc1, Vcc2) and low-voltage state (ground voltage Vss) of a signal and a signal line are herein sometimes referred to as "H level" and "L level".

Each normal memory cell MC and each spare memory cell SMC have a tunneling magneto-resistance element TMR and an access transistor ATR which are connected in series. Tunneling magneto-resistance element TMR functions as a magnetic storage portion having an electric resistance varying according to the storage data level, and access transistor ATR functions as an access gate. As described before, a MOS (Metal Oxide Semiconductor) transistor, a field effect transistor formed on a semiconductor substrate, is typically used as access transistor ATR. Tunneling magneto-resistance element TMR is magnetized in one of the two magnetization directions, and the electric resistance thereof is set to either Rmin or Rmax. Hereinafter, the difference between electric resistances, (Rmax−Rmin), is denoted with ΔR.

Normal memory cells MC of each row are connected to either bit line BL or /BL. For example, regarding the normal memory cells of the first memory cell column, the normal memory cell of the first row is connected to bit line /BL1, and the normal memory cell of the second row is connected to bit line BL1. Similarly, the normal memory cells in the odd rows are connected to bit lines /BL1 to /BLm, and those in the even rows are connected to bit lines BL1 to BLm. Spare memory cells SMC in the odd rows are connected to spare bit lines /SBL1 to /SBLk, and those in the even rows are connected to spare bit lines SBL1 to SBLk.

Memory array 10 further includes a plurality of dummy memory cells DMC coupled to bit lines BL1, /BL1 to BLm, /BLm and spare bit lines SBL1, /SBL1 to SBLk, /SBLk.

Each dummy memory cell DMC has a dummy resistance element TMRd and a dummy access element ATRd. The electric resistance Rd of dummy resistance element TMRd is equal to an intermediate value of electric resistances Rmax, Rmin corresponding to storage data levels "1", "0" of MTJ memory cell MC (i.e., Rmax>Rd>Rmin). Like the access elements of the MTJ memory cells, a field effect transistor is typically used as dummy access transistor ATRd. Therefore, the dummy access element is hereinafter sometimes referred to as dummy access transistor ATRd.

Dummy memory cells DMC are arranged corresponding to dummy read word lines DRWL1, DRWL2. More specifically, dummy memory cells DMC are arranged in two rows by (m+k) columns. The dummy memory cells corresponding to dummy read word line DRWL1 are respectively coupled to bit lines BL1 to BLm and spare bit lines SBL1 to SBLk. The remaining dummy memory cells corresponding to dummy read word line DRWL2 are respectively coupled to bit lines /BL1 to /BLm and spare bit lines /SBL1 to /SBLk. Hereinafter, dummy read word lines DRWL1, DRWL2 are sometimes generally referred to as dummy read word lines DRWL.

Dummy write word lines DWWL1, DWWL2 are provided corresponding to the dummy memory cell rows. Note that the dummy write word lines may not be required depending on the structure of dummy resistance element TMRd. Dummy write word lines DWWL1, DWWL2 having the same design as that of write word lines WWL are provided in order to assure continuity of the shape on the memory array and prevent complication of a manufacturing process.

In data read operation, word line driver 30 selectively activates read word line RWL and dummy read word line DRWL1, DRWL2 to H level (power supply voltage Vcc1) according to the row selection result. More specifically, when an odd row is selected, the normal memory cells and spare memory cells corresponding to the selected row are connected to bit lines /BL1 to /BLm and spare bit lines /SBL1 to /SBLk. In addition, dummy read word line DRWL1 is activated so that corresponding dummy memory cells are connected to bit lines BL1 to BLm and spare bit lines SBL1 to SBLk. When an even row is selected, dummy read word line DRWL2 is activated in addition to read word line RWL of the selected row.

In data write operation, word line driver 30 couples one end of the selected write word line WWL to power supply voltage Vcc2. Like the first embodiment, this allows a data write current Ip of the row direction to be applied to the selected write word line WWL in the direction from word line driver 30 toward region 40. Word line driver 30 couples the non-selected write word lines to ground voltage Vss.

Column selection lines CSL1 to CSLm for selecting a column are provided corresponding to the memory cell columns. In data write operation and data read operation, column decoder 25 activates one of column selection lines CSL1 to CSLm to the selected state (H level) according to the decode result of column address CA, that is, the column selection result.

Moreover, spare column selection lines SCSL1 to SCSLk are provided corresponding to the spare memory cell columns. Each spare column driver SCV1 to SCVk activates a corresponding spare column selection line to the selected state (H level) in response to a spare enable signal SE1 to SEk from redundant control circuit 105. How spare enable signal SE1 to SEk is generated will be specifically described later.

A data bus pair DBP is provided in order to transmit read data and write data therethrough. Data bus pair DBP is comprised of two complementary data buses DB, /DB.

Read/write control circuit 50 includes a data write circuit 51W, a data read circuit 51R, column selection gates CSG1 to CSGm, and spare column selection gates SCSG1 to SCSGk. Column selection gates CSG1 to CSGm are provided corresponding to the memory cell columns, and spare column selection gates SCSG1 to SCSGk are provided corresponding to the spare memory cell columns.

Hereinafter, column selection lines CSL1 to CSLm, spare column selection lines SCSL1 to SCSLk, column selection gates CSG1 to CSGm and spare column selection gates SCSG1 to SCSGk are sometimes generally referred to as column selection lines CSL, spare column selection lines SCSL, column selection gates CSG and spare column selection gates SCSG, respectively.

Each column selection gate CSG includes two transistor switches. One of the transistor switches is electrically coupled between data bus DB and corresponding bit line BL, and the other transistor switch is electrically coupled between data bus /DB and corresponding bit line /BL. These transistor switches are turned ON/OFF according to the voltage on a corresponding column selection line CSL. More specifically, when a corresponding column selection line CSL is activated to the selected state (H level), column selection gate CSG electrically couples data buses DB, /DB to corresponding bit lines BL, /BL, respectively.

Each spare column selection gate SCSG has the same structure as that of column selection gate CSG. When a corresponding spare column selection line SCSL is activated to the selected state (H level), spare column selection gate SCSG electrically couples data buses DB, /DB to corresponding spare bit lines SBL, /SBL, respectively.

Hereinafter, column selection operation in MRAM device 1 will be described. As described before, column selection operation includes redundant control for repairing a defective column.

Program circuit 100 is capable of storing k defective addresses FAD1 to FADk. Defective addresses FAD1 to FADk programmed in program circuit 100 are transmitted to redundant control circuit 105. Redundant control circuit 105 determines whether column address CA designating the selected column matches defective addresses FAD1 to FADk or not.

Figure 3:
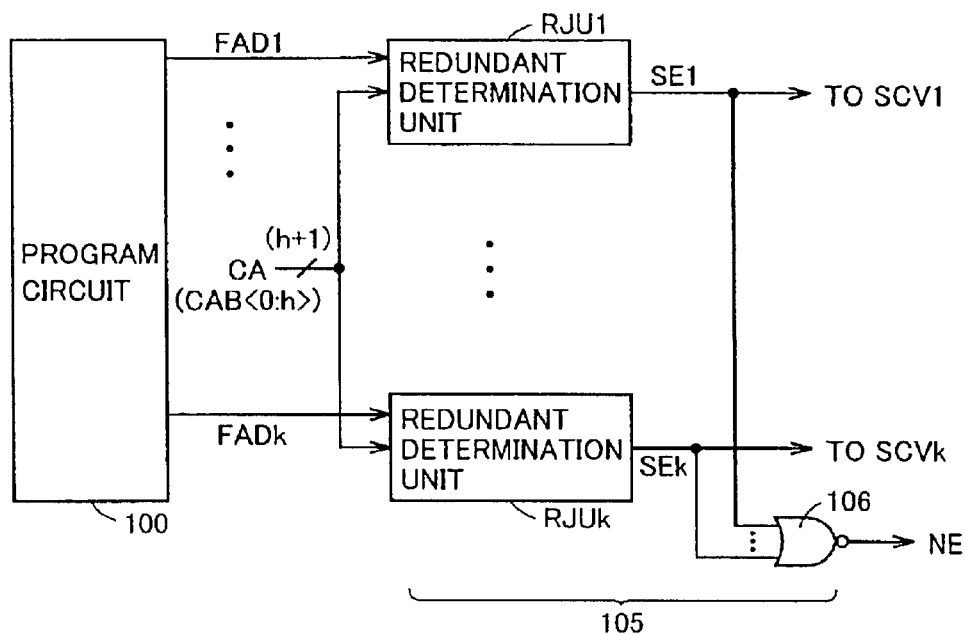
FIG. 3 is a block diagram showing the structure of a redundant control circuit.

Referring to FIG. 3, redundant control circuit 105 includes redundant determination units RJU1 to RJUk and a normal access control gate 106. Redundant determination units RJU1 to RJUk are provided corresponding to defective addresses FAD1 to FADk. A (h+1)-bit column address CA is applied to each redundant determination unit RJU1 to RJUk. (h+1)-bit column address CA has column address bits CAB<0:h> (i.e., CAB(0) to CAB(h), where h is a natural number). Program circuit 100 applies defective addresses FAD1 to FADk to redundant determination units RJU1 to RJUk, respectively. Like column address CA, each defective address FAD1 to FADk is a (h+1)-bit address.

Each redundant determination unit RJU1 to RJUk produces a spare enable signal SE1 to SEk based on the comparison result between column address CA and defective address FAD1 to FADk. Hereinafter, redundant determination units RJU1 to RJUk, defective addresses FAD1 to FADk and spare enable signals SE1 to SEk are sometimes generally referred to as redundant determination units RJU, defective addresses FAD, and spare enable signals SE, respectively.

Each redundant determination unit RJU activates a corresponding spare enable signal SE to H level when column address CA matches a corresponding defective address FAD. For example, redundant determination unit RJU1 activates spare enable signal SE1 to H level when column address CA matches defective address FAD1.

Since redundant determination units RJU1 to RJUk in FIG. 3 have the same structure, only the structure of redundant determination unit RJU1 will be described with reference to FIG. 4.

Figure 4:
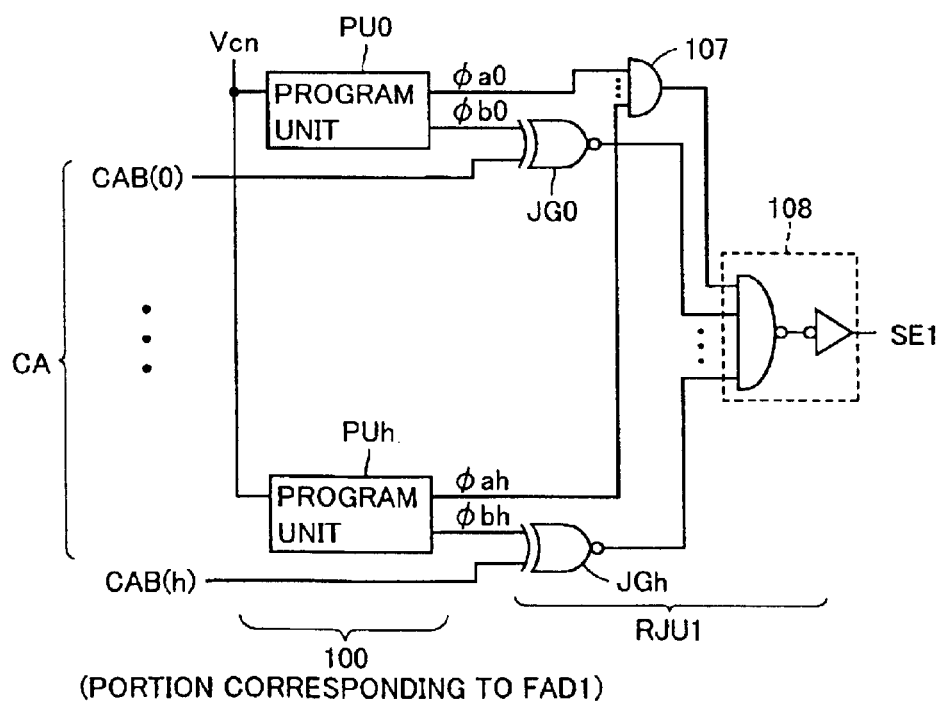
FIG. 4 is a block diagram showing the structure of a redundant determining unit in FIG. 3.

Referring to FIG. 4, program circuit 100 has a plurality of program units PU for storing program data of program information. Each program unit PU transitions from a non-program state, an initial state, to a program state in response to a magnetic program input, and stores one-bit program data in a non-volatile manner. FIG. 4 exemplarily shows only program units PU0 to PUh corresponding to redundant determination unit RJU1. Each program unit PU0 to PUh stores a corresponding bit of (h+1)-bit defective address FAD1.

In program data read operation, program units PU0 to PUh respectively output program signals φa0, φb0 to φah, φbh according to the magnetization state thereof. Hereinafter, program signals φa0 to φah, φb0 to φbh are sometimes generally referred to as program signals φa, φb, respectively. Each program signal φa, φb is a one-bit signal for use in non-volatile storage of program information, that is, in programming operation.

Program signal φa is a signal indicating whether a corresponding program unit PU is in the non-program state or the program state. Program signal φb is a signal indicating the program data level stored in a corresponding program unit PU.

Redundant determination unit RJU1 includes a logic gate 107, match determination gates JG0 to JGh, and a logic circuit 108. Logic gate 107 outputs the AND logic operation result of program signals φa0 to φah. Match determination (Exclusive-NOR) gates JG0 to JGh are provided corresponding to program units PU0 to PUh. Logic circuit 108 generates a spare enable signal according to the outputs of logic gate 107 and match determination gates JG0 to JGh.

Each match determination unit JG0 to JGh outputs an H-level signal when a corresponding one of column address bits CAB(0) to CAB(h) matches a defective address bit stored in a corresponding one of program units PU0 to PUh. Otherwise, each match determination unit JG0 to JGh outputs an L-level signal. Accordingly, the output of every match determination unit JG0 to JGh is set to H level when a column address indicated by column address bits CAB(0) to CAB(h) matches defective address FAD1.

Program signal φa is set to L level when a corresponding program unit PU is in the non-program state, and set to H level when it is in the program state. Accordingly, the output of logic gate 107 is set to H level when each program unit PU0 to PUh is in the program state.

Thus, when defective address FAD1 is programmed with program units PU0 to PUh and column address CA matches defective address FAD1, redundant determination unit RJU1 activates spare enable signal SE1 to H level in order to designate a corresponding redundant circuit (spare column) RD1 as a redundant circuit to be accessed.

Referring back to FIG. 3, spare enable signals SE1 to SEk are transmitted to spare column drivers SCV1 to SCVk, respectively. Each spare column driver SCV1 to SCVk activates a corresponding spare column selection line SCSL to the selected state (H level) in response to activation of a corresponding spare enable signal SE to H level.

Normal access control gate 106 outputs the NOR operation result of spare enable signals SE1 to SEk as a normal enable signal NE. Accordingly, when column address CA matches any one of defective addresses FAD1 to FADk, normal enable signal NE is inactivated to L level in order to discontinue access to a normal memory cell by column decoder 25. On the other hand, when column address CA does not match any one of defective addresses FAD1 to FADk, normal enable signal NE is activated to H level.

Figure 5:
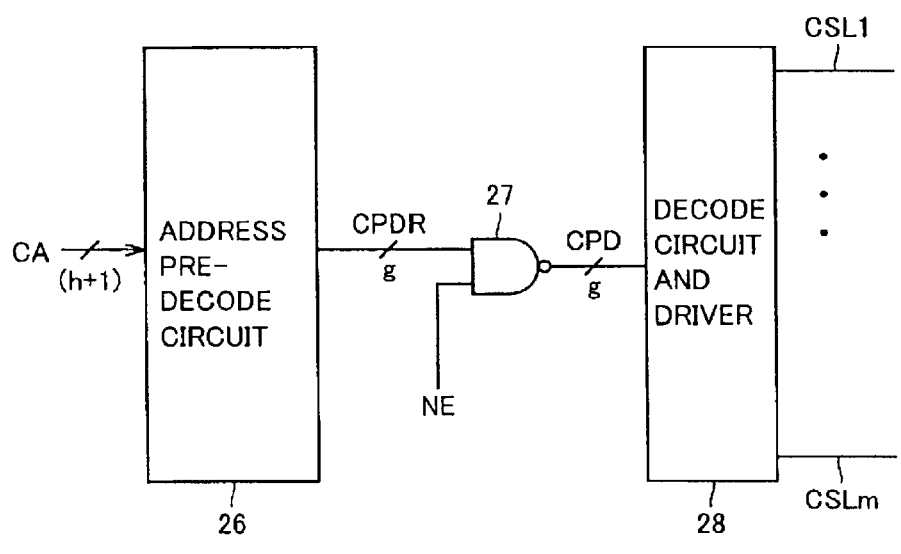
FIG. 5 is a schematic block diagram showing the structure of a column decoder.

Referring to FIG. 5, column decoder 25 includes an address predecode circuit 26, a control gate 27 and a decode circuit and driver 28.

Address pre-decode circuit 26 pre-decodes a (h+1)-bit column address CA and generates a g-bit pre-decode signal CPDR (where g is an integer satisfying g>(h+1)). Control gate 27 receives g-bit pre-decode signal CPDR and normal enable signal NE from redundant control circuit 105, and produces a g-bit column pre-decode signal CPD.

Control gate 27 collectively indicates g-bit NAND gates for performing NAND operation of a corresponding bit of pre-decode signal CPDR and normal enable signal NE. Accordingly, if normal enable signal NE is activated to H level, column pre-decode signal CPD would correspond to pre-decode signal CPDR with each bit inverted. When normal enable signal NE is inactivated to L level, each bit of column pre-decode signal CPD is fixed to H level.

Decode circuit and driver 28 selectively activates column selection line CSL1 to CSLm in response to column pre-decode signal CPD from control gate 27. Accordingly, when normal enable signal NE is activated to H level, that is, when column address CA matches any one of defective addresses FAD, a single column selection line CSL corresponding to column address CA is activated and corresponding normal memory cells are accessed.

On the other hand, when normal enable signal NE is inactivated to L level, that is, when column address CA does not match any one of defective addresses FAD, every column selection line CSL1 to CSLm corresponding to the normal memory cells is inactivated, and no normal memory cell is accessed.

Referring back to FIG. 2, read/write control circuit 60 includes short-circuit switch transistors 62-1 to 62-$m$, 62-$s1$ to 62-$sk$ and control gates 66-1 to 66-$m$, 66-$s1$ to 66-$sk$, which are provided corresponding to the memory cell columns. Read/write control circuit 60 further includes precharge transistors 64-1$a$, 64-1$b$ to 64-$ma$, 64-$mb$ and 64-$s1a$, 64-$s1b$ to 64-$ska$, 64-$skb$. These precharge transistors are respectively provided between ground voltage Vss and bit lines BL1, /BL1 to BLm, /BLm and spare bit lines SBL1, /SBL1 to SBLk, /SBLk.

Hereinafter, short-circuit switch transistors 62-1 to 62-$m$, 62-$s1$ to 62-$sk$, precharge transistors 64-1$a$, 64-1$b$ to 64-$ma$, 64-*mb* and 64-*s1a*, 64-*s1b* to 64-*ska*, 64-*skb* and control gates 66-1 to 66-*m*, 66-*s*1 to 66-*sk* are sometimes generally referred to as short-circuit switch transistors 62, precharge transistors 64, and control gates 66, respectively.

Each control gate 66 outputs the AND logic operation result of a corresponding column selection line CSL or spare column selection line SCSL and a control signal WE. Accordingly, in data write operation, the output of control gate 66 is selectively activated to H level in the selected column or spare column corresponding to column address CA.

Each short-circuit switch transistor 62 is turned ON/OFF in response to the output of a corresponding control gate 66. Accordingly, in data write operation, bit lines BL, /BL or spare bit lines SBL, /SBL of the selected column or spare column corresponding to column address CA are electrically coupled to each other at their one ends through a corresponding short-circuit switch transistor 62.

Each precharge transistor 64 is turned ON in response to activation of a bit line precharge signal BLPR, and precharges bit lines BL1, /BL1 to BLm, /BLm and spare bit lines SBL1, /SBL1 to SBLk, /SBLk to ground voltage Vss. Bit line precharge signal BLPR generated by control circuit 5 is activated to H level at least in a prescribed period before data read operation is started within the active period of MRM device 1. On the other hand, in data read operation and data write operation in the active period of MRAM device 1, bit line precharge signal BLPR is inactivated to L level, and precharge transistors 64 are turned OFF.

Figure 6:
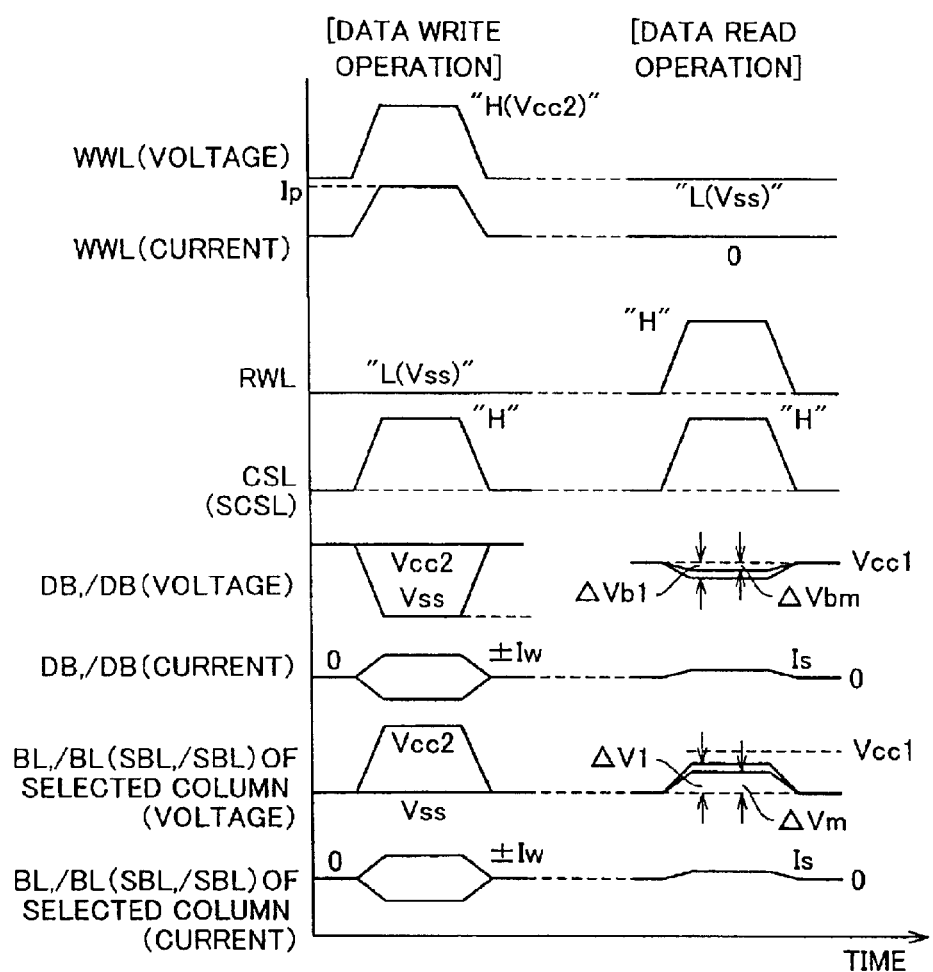
FIG. 6 is a waveform chart of data read operation and data write operation, illustrating redundant replacement in the MRAM device.

Hereinafter, redundant replacement in data read operation and data write operation of the MRAM device will be described with reference to FIG. 6.

First, data write operation will be described. Word line driver 30 activates write word line WWL of the selected row according to the row selection result of row decoder 20, and connects the activated write word line WWL to power supply voltage Vcc. Since each write word line WWL has its one end coupled to ground voltage Vss in region 40, a data write current Ip is supplied to write word line WWL of the selected row in the direction from word line driver 30 toward region 40. In the non-selected rows, write word lines WWL are held in the inactive state (L level: ground voltage Vss). Therefore, no data write current flows therethrough.

When column address CA does not match any one of defective addresses FAD, column selection line CSL of the selected column is activated to the selected state (H level), and bit lines BL, /BL of the selected column are respectively coupled at one ends to data buses DB, /DB. Moreover, a corresponding short-circuit transistor 62 is turned ON to short-circuit bit lines BL, /BL of the selected column at the other ends (the ends located opposite to column selection gates CSG).

On the other hand, when column address CA matches any one of defective addresses FAD, a corresponding spare column selection line SCSL is activated to the selected state (H level), and corresponding spare bit lines SBL, /SBL are respectively coupled at their one ends to data buses DB, /DB, instead of bit lines BL, /BL of the selected column. Moreover, a corresponding short-circuit switch transistor 62 is turned ON to short-circuit corresponding spare bit lines SBL, /SBL at the other ends (the ends located opposite to spare column selection gate SCSG).

Data write circuit 51W sets data bus DB to one of power supply voltage Vcc2 and ground voltage Vss, and sets data bus /DB to the other voltage. For example, when write data DIN is at L level, a data write current −Iw for writing L-level data is supplied to data bus DB. Data write current −Iw is supplied to bit line BL of the selected column or corresponding spare bit line SBL through column selection gate CSG or spare column selection gate SCSG.

Data write current −Iw supplied to bit line BL of the selected column or corresponding spare bit line SBL is returned by short-circuit switch transistor 62. As a result, a data write current +Iw of the opposite direction is supplied to the other bit line /BL or the other spare bit line /SBL. Data write current +Iw supplied to bit line /BL or spare bit line /SBL is transmitted to data bus /DB through column selection gate CSG or spare column selection gate SCSG.

When write data DIN is at H level, data write circuit 51W sets data buses DB, /DB to power supply voltage Vcc2 and ground voltage Vss in the opposite manner. This allows a data write current of the opposite direction to be supplied to bit lines BL, /BL of the selected column or corresponding spare bit lines SBL, /SBL.

When column address CA does not match any one of defective addresses FAD, data is written to a normal memory cell (selected memory cell) corresponding to both write word line WYL and bit line BL (/BL) receiving a data write current. On the other hand, when column address CA matches any one of defective addresses FAD, data is written to a spare memory cell corresponding to both write word line WWL and spare bit line SBL (/SBL) receiving a data write current.

In data write operation, read word lines RWL are held in the non-selected state (L level). In data write operation, bit line precharge signal BLPR is activated to H level in order to set bit lines BL, /BL to ground voltage Vss, a voltage corresponding to the precharge voltage level in data read operation. As a result, bit lines BL, /BL and spare bit lines SBL, /SBL of the non-selected columns have the precharge voltage in preparation for data read operation. This eliminates the need for additional precharge operation to be conducted before data read operation, enabling improvement in read operation speed.

Hereinafter, data read operation will be described.

In data read operation, word line driver 30 activates read word line RWL of the selected row to H level according to the row selection result of row decoder 20. In the non-selected rows, read word lines RWL are retained in the inactive state (L level).

When data read operation is started, read word line RWL of the selected row is activated to H level, and corresponding access transistors ATR are turned ON. In response to this, normal memory cells and spare memory cells corresponding to the selected row are electrically coupled between ground voltage Vss and bit lines BL, /BL and spare bit lines SBL, /SBL through access transistors ATR, respectively.

Data read circuit 51R pulls up data buses DB, /DB to power supply voltage Vcc1 to supply a constant sense current Is.

As in data write operation, column selection line CSL of the selected column or corresponding spare column selection line SCSL are activated to the selected state (H level) according to column address CA.

When column address CA does not match any one of defective addresses FAD, sense current Is flows through tunneling magneto-resistance element TMR of the selected memory cell (normal memory cell) through data bus DB (/DB) and bit line BL (/BL) of the selected column. As a result, one of bit lines BL, /BL of the selected column and one of data buses DB, /DB are subjected to a voltage change according to the electric resistance (Rmax, Rmin) of tunneling magneto-resistance element TMR, that is, the storage data level of the selected memory cell. Similarly, the other bit line of the selected column and the other data bus are subjected to a voltage change according to electric resistance Rd of dummy resistance element TMRd in dummy memory cell DMC.

For example, provided that the selected memory cell stores data "1" (electric resistance Rmax), one of bit lines BL, /BL coupled to the selected memory cell is subjected to a voltage change ΔV1 that is greater than a voltage change ΔVm on the other bit line coupled to dummy memory cell DMC (ΔV1>ΔVm). Similarly, data buses DB, /DB are subjected to a voltage change ΔVb1, ΔVbm, respectively (ΔVbm>ΔVb1). Data read circuit 51R senses and amplifies the voltage difference between data buses DB, /DB, and outputs the storage data of the selected memory cell as read data DOUT.

On the other hand, when column address CA matches any one of defective addresses FAD, sense current Is flows through tunneling magneto-resistance element TMR of a spare memory cell through data bus DB (/DB) and bit line BL (/BL) of the selected column. As a result, one of spare bit lines SBL, /SBL and one of data buses DB, /DB are subjected to a voltage change according to the electric resistance (Rmax, Rmin) of tunneling magneto-resistance element TMR, that is, the storage data level of the spare memory cell. The other bit line of the selected column and the other data bus are subjected to a voltage change according to electric resistance Rd of dummy resistance element TMRd, as in the case where a normal memory cell is accessed.

Thus, even when a defective column is selected by column address CA, data write operation and data read operation can be conducted properly by accessing a spare memory cell of a corresponding redundant circuit (spare column). Accordingly, a defective memory cell can be replaced on a column-by-column basis by using a spare column corresponding to a redundant circuit.

Bit lines BL, /BL and spare bit lines SBL, /SBL are herein precharged to ground voltage Vss. Therefore, no discharge current will be generated from bit lines BL, /BL and spare bit lines SBL, /SBL of the nonselected columns through access transistors ATR turned ON in response to activation of read word line RWL of the selected row. This enables reduction in power consumption resulting from charging and discharging of the bit lines and sub bit lines in precharge operation.

Note that power supply voltage Vcc2, an operating power supply voltage of data write current 51W, is higher than power supply voltage Vcc1, an operating power supply voltage of data read circuit 51R. This is because data write currents Ip, ±Iw required to magnetize tunneling magneto-resistance element TMR of the selected memory cell in data write operation is greater than sense current Is required for data read operation. For example, an external power supply voltage supplied from the outside of MRAM device 1 may be used as power supply voltage Vcc2, and power supply voltage Vcc1 may be generated by down-converting the external power supply voltage by a not-shown voltage down-converter. This enables efficient supply of power supply voltages Vcc1, Vcc2.

Hereinafter, the structure of the program circuit for efficiently storing defective addresses, that is, program information, will be described.

Figures 7, 8:
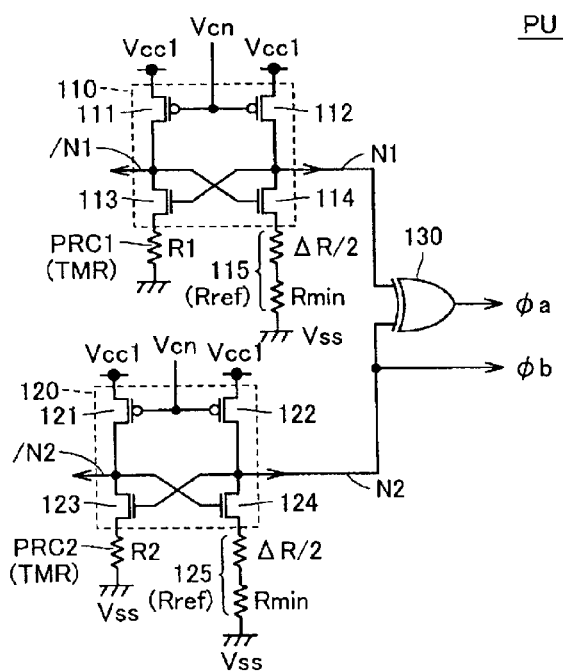
FIG. 7 is a circuit diagram showing the structure of a program unit according to a first embodiment of the present invention.
FIG. 8 shows the relation between the electric resistance of program cells and the state of a program unit.

FIG. 7 is a circuit diagram showing the structure of program unit PU in FIG. 4 according to the first embodiment of the present invention.

Referring to FIG. 7, program unit PU includes program cells PRC1, PRC2 for magnetically storing program data, i.e., defective address bits, in a non-volatile manner. As specifically described later, each program cell PRC1, PRC2 is formed from a magneto-resistance element having the same structure as that of tunneling magneto-resistance element TMR of a normal memory cell. Like tunneling magneto-resistance element TMR of a normal memory cell, each program cell PRC1, PRC2 is magnetized in one of the two magnetization directions. Therefore, like tunneling magneto-resistance element TMR of a normal memory cell, one of electric resistances R1, R2 of each program cell is set to one of Rmin and Rmax, and the other electric resistance is set to the other.

Program unit PU further includes current sense amplifiers 110, 120, reference resistors 115, 125 and a logic gate 130, which are provided corresponding to program cells PRC1 and PRC2.

Reference resistors 115, 125 have an electric resistance Rref that is equal to an intermediate value of Rmin and Rmax, and preferably, Rref=Rmin+ΔR/2. For example, a part of the reference resistors may be formed from a magneto-resistance element having the same structure as that of tunneling magneto-resistance element TMR and holding storage data corresponding to electric resistance Rmin.

Current sense amplifier 110 includes P-channel MOS transistors 111, 112 and N-channel MOS transistors 113, 114. P-channel MOS transistor 111 and N-channel MOS transistor 113 are connected in series between power supply voltage Vcc1 and program cell PRC1. P-channel MOS transistor 112 and N-channel MOS transistor 114 are connected in series between power supply voltage Vcc1 and reference resistor 115. Program cell PRC1 is coupled between N-channel MOS transistor 113 and ground voltage Vss. Reference resistor 115 is connected between N-channel MOS transistor 114 and ground voltage Vss.

P-channel MOS transistors 111, 112 receive a control voltage Vcn from control circuit 5 at their gates. N-channel MOS transistor 113 has its gate connected to a node N1, a connection node between P-channel MOS transistor 112 and N-channel MOS transistor 114. N-channel MOS transistor 114 has its gate connected to a node /N1, a connection node between P-channel MOS transistor 111 and N-channel MOS transistor 113.

Current sense amplifier 120 has the same structure as that of current sense amplifier 110. More specifically, current sense amplifier 120 has P-channel MOS transistors 121, 122 and N-channel MOS transistors 123, 124. Program cell PRC2 is connected between N-channel MOS transistor 123 and ground voltage Vss. Reference resistor 125 is connected between N-channel MOS transistor 124 and ground voltage Vss.

N-channel MOS transistor 123 has its gate connected to a node N2, a connection node between P-channel MOS transistor 122 and N-channel MOS transistor 124. N-channel MOS transistor 124 has its gate connected to a node /N2, a connection node between P-channel MOS transistor 121 and N-channel MOS transistor 123.

Logic gate 130 outputs the exclusive-OR (EX-OR) logic operation result of the signal levels on nodes N1, N2 as a program signal φa. Accordingly, program signal φa is set to L level when program cells PRC1, PRC2 have the same electric resistance. Otherwise, program signal φa is set to H level. The signal level on node N2 is output as a program signal φb.

FIG. 8 shows the relation between electric resistance of program cells and the state of a program unit.

Referring to FIG. 8, in the initial state, program cells PRC1, PRC2 are magnetized in the same direction and have the same electric resistance. It is herein assumed that program cells PRC1, PRC2 have electric resistance Rmin in the initial state.

In the program state, program cells PRC1, PRC2 are magnetized in different directions, and complementary data are written thereto. In other words, either program cell PRC1 or PRC2 is magnetized in the direction different from the initial state. Which of the program cells is magnetized in the direction different from the initial state is determined according to program data to be written.

More specifically, in program data write operation, one of the following two data write operations is selectively conducted according to program data to be written: the magnetization direction of program cell PRC2 is changed and the magnetization direction of program cell PRC1 is retained in the same direction as in the initial state (R1=Rmin, R2=Rmax; hereinafter, this state is sometimes referred to as "program state 1"); and the magnetization direction of program cell PRC1 is changed and the magnetization direction of program cell PRC2 is retained in the same direction as in the initial state (R1=Rmax, R2=Rmin; hereinafter, this state is sometimes referred to as "program state 2").

In a program cell that is not subjected to program data write operation, that is, a program cell in the non-program state, electric resistances R1, R2 of program cells PRC1, PRC2 are the same as those in the initial state (R1=R2=Rmin).

Hereinafter, the level of the program signals in program data read operation and program data write operation will be described with reference to FIGS. 9A, 9B and 9C.

Figure 9A:
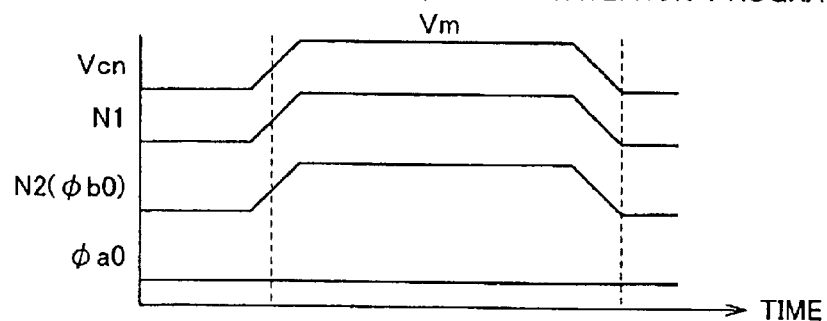
FIGS. 9A, 9B and 9C are waveform charts illustrating the level of program signals in program data read operation and program data write operation.

Referring to FIG. 9A, in the initial state, electric resistances R1, R2 of program cells PRC1, PRC2 are lower than resistance value Rref of reference resistor 115. Therefore, even when control voltage Vcn is changed to intermediate voltage Vm (Vss<Vm<Vcc) for program data read operation, the voltages on nodes N1, N2 rise to H level. Accordingly, logic gate 130 outputs an L-level program signal φa (ground voltage Vss) indicating the non-program state.

As specifically described later, in the present embodiment, both program cells PRC1, PRC2 have electric resistance Rmin in the initial state (non-program state) in order to simplify the manufacturing process of the MRAM device. This allows logic gate 130 of FIG. 7 to be replaced not with a match comparison gate but with a NAND gate having a simpler structure.

Figure 9B:
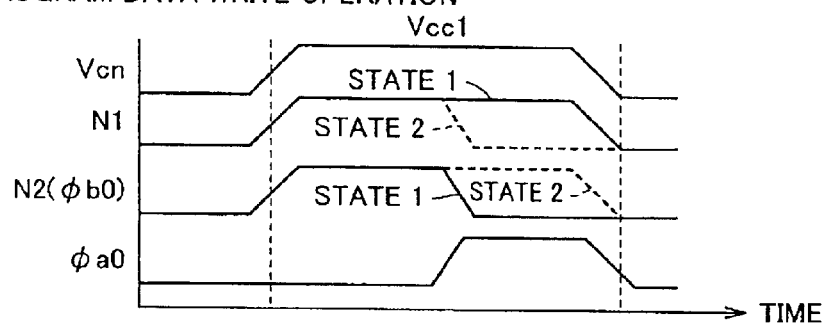

Referring to FIG. 9B, in program data write operation, control voltage Vcn is set to power supply voltage Vcc in order to discontinue current supply from current sense amplifiers 110, 120 to program cells PRC1, PRC2. Moreover, complementary data are respectively written to program cells PRC1, PRC2 according to program state 1 or program state 2. The structure for writing the program data to program cells PRC1, PRC2 will be specifically described later.

Figure 9C:
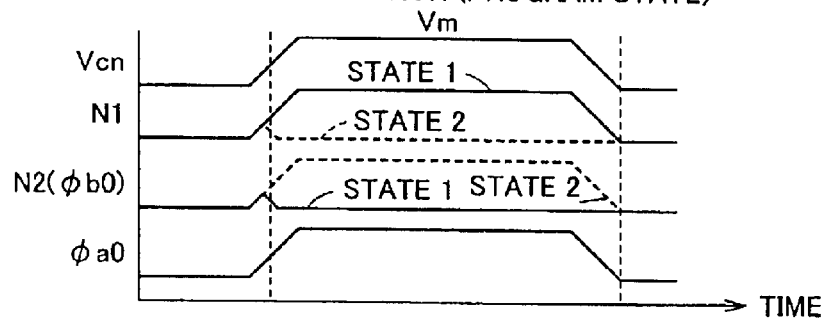

FIG. 9C illustrates program data read operation from a program unit in the program state. When voltage Vcn is set to intermediate voltage Vm, current sense amplifiers 110, 120 set nodes N1, N2 to different voltage levels. In program state 1 (R2=Rmax, R1=Rmin), the voltage on node N1 rises to H level, whereas the voltage on node N2 is retained at L level. In program state 2 (R1=Rmax, R2=Rmin), the voltage on node N1 is retained at L level, whereas the voltage on node N2 rises to H level.

Accordingly, in the program state, program signal φa is set to H level regardless of whether the program unit is in program state 1 or program state 2. However, program signal φb is set to H level or L level depending on whether the program unit is in program state 1 or program state 2.

The above structure enables each program unit to store both one-bit program data and information of whether the program unit stores program data or not by using two program cells PRC1, PRC2 each formed from the same magneto-resistance element as that of a normal memory cell.

Hereinafter, the arrangement of program cells will be described.

Note that, hereinafter, program cells PRC1, PRC2 are sometimes generally referred to as program cells PRC.

Referring to (a) in FIG. 10, tunneling magneto-resistance element TMR of each normal memory cell MC is provided at the intersection of write word line WWL corresponding to a memory cell row and bit line BL corresponding to a memory cell column. A data write current flowing through write word line WWL applies a magnetic field of the hard-axis (HA) direction to tunneling magneto-resistance element TMR. A data write current flowing through bit line BL applies a magnetic field of the easy-axis (EA) direction to tunneling magneto-resistance element TMR.

Referring to (b) in FIG. 10, each program cell PRC is provided at the intersection of a program word line PWL and a program bit line PBL. Program cell PRC has the same design and is fabricated in the same manner as that of tunneling magneto-resistance element TMR.

Program word line PWL and program bit line PBL extend in different directions. A program current for generating a magnetic field of the hard-axis (HA) direction is applied to program word line PWL. A program current for generating a magnetic field of the easy-axis (EA) direction is applied to program bit line PBL.

Figure 11A:
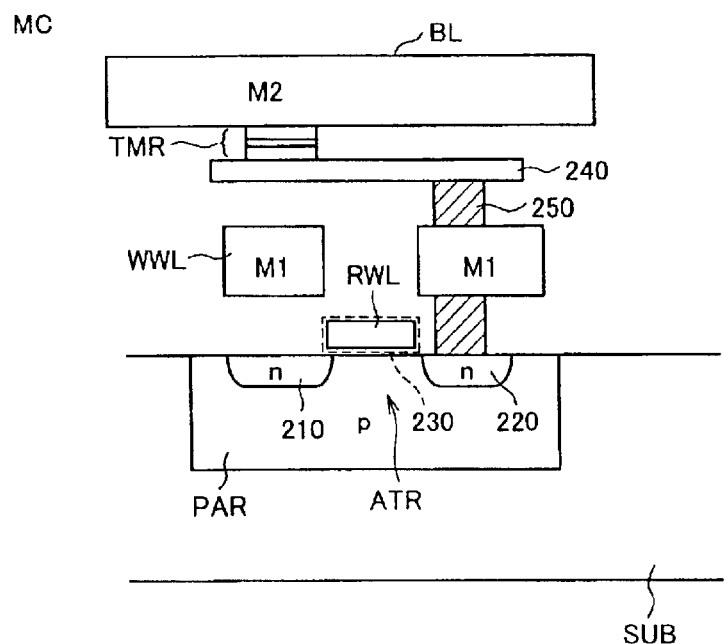
FIGS. 11A and 11B show the arrange of a normal memory cell and a program cell, respectively.
Figure 11B:
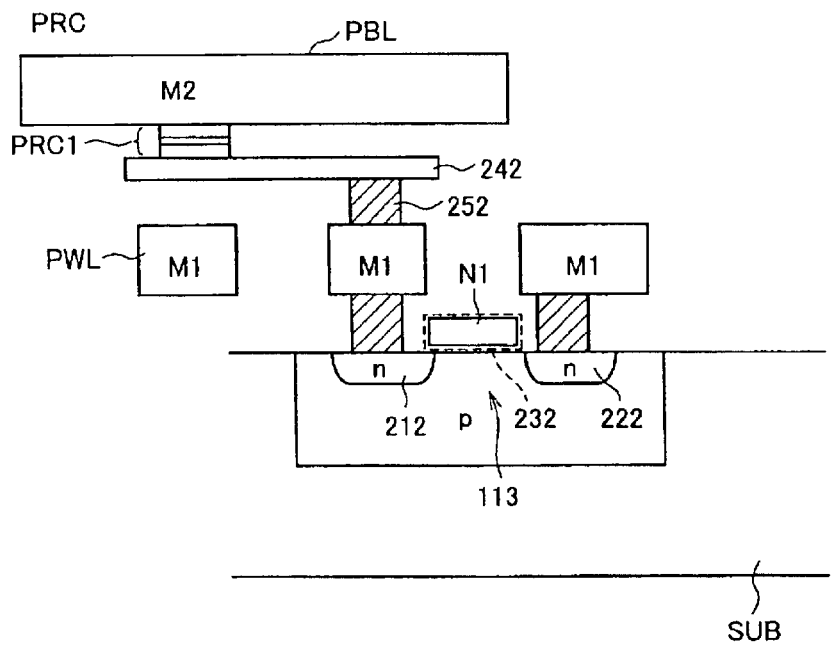

FIGS. 11A and 11B show the arrangement of a normal memory cell and a program cell, respectively.

Referring to FIG. 11A, access transistor ATR is formed in a p-type region PAR of a semiconductor main substrate SUB. Access transistor ATR has source/drain regions (n-type regions) 210, 220 and a gate 230. Although not shown in the figure, source/drain region 210 is coupled to ground voltage Vss. Write word line WWL is formed in a first metal wiring layer M1.

Since read word line RWL is provided in order to control the gate voltage of access transistor ATR, a current need not be actively supplied thereto. For improved integration, read word line RWL is formed in the same wiring layer as that of gate 230 by using a polysilicon layer or a polycide structure. In other words, no additional metal wiring layer is required for read word line RWL. On the other hand, bit line BL is formed in a second metal wiring layer M2 and is electrically coupled to tunneling magneto-resistance element TMR.

Source/drain region 220 of access transistor ATR is electrically coupled to tunneling magneto-resistance element TMR through a metal film 250, first metal wiring layer M1 and a barrier metal 240. Metal film 250 is formed in a contact hole. Barrier metal 240 is a buffer material for electrically coupling tunneling magneto-resistance element TMR and metal wiring.

FIG. 11B exemplarily shows the structure of program cell PRC1 in FIG. 7.

Referring to FIG. 11B, N-channel MOS transistor 113 connected to program cell PRC1 is formed in a p-type region of a semiconductor main substrate SUB. N-channel MOS transistor 113 has source/drain regions (n-type regions) 212, 222 and a gate 232. Program word line PWL is formed in the same metal wiring layer M1 as that of write word line WWL corresponding to normal memory cell MC.

Source/drain region 212 is coupled to program cell PRC1 through a barrier metal 242, a metal film 252 formed in a contact hole, and a metal wiring formed in metal wiring layer M1. Source/drain region 222 is coupled to a metal wiring connected to node /N1 in current sense amplifier 110 of FIG. 7.

Program bit line PBL is formed in the same metal wiring layer M2 as that of bit line BL corresponding to normal memory cell MC, and is electrically coupled to program cell PRC1. Program bit line PBL is fixed to ground voltage Vss in operation other than program data write operation. Gate 232 is connected to node N1 in current sense amplifier 110 of FIG. 7.

With the above structure, program cells PRC can be manufactured simultaneously with normal memory cells MC in the manufacturing process of normal memory cells MC. In other words, no special manufacturing process is required for program cells PRC.

Hereinafter, the structure for supplying a program current in program data write operation will be described.

Figure 12:
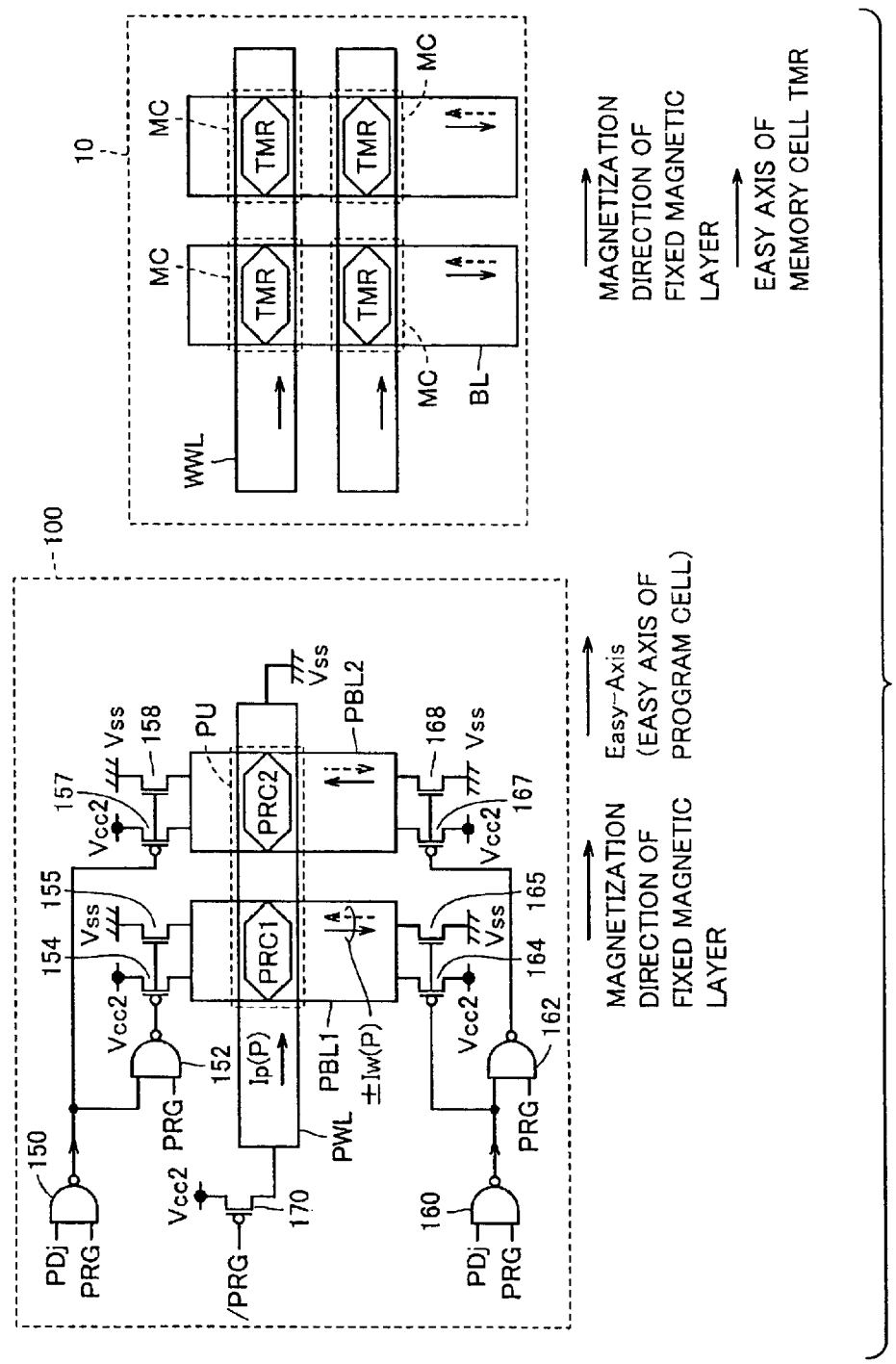
FIG. 12 is a circuit diagram showing the structure for supplying a program current in program data write operation.

Referring to FIG. 12, a common program word line PWL is provided for program cells PRC1, PRC2. Program bit lines PBL1, PBL2 are provided for program cells PRC1, PRC2, respectively.

Write word lines WWL in memory array 10 and program word lines PWL in program circuit 100 extend in the same direction. Similarly, bit lines BL in memory array 10 and program bit lines PBL1, PBL2 in program circuit 100 extend in the same direction.

Tunneling magneto-resistance elements TMR of the normal memory cells and magneto-resistance elements corresponding to program cells PRC1, PRC2 are arranged in the same direction. Therefore, the fixed magnetic layers of program cells PRC can be magnetized simultaneously with those of tunneling magneto-resistance elements TMR in the step of applying a magnetic field for magnetizing the fixed magnetic layers of tunneling magneto-resistance elements TMR in a prescribed direction. This magnetizing step is a part of the manufacturing process of the MRAM device. In this magnetizing step, the free magnetic layers of tunneling magneto-resistance elements TMR in the normal memory cells and the free magnetic layers of program cells PRC are also magnetized in the same direction as that of the fixed magnetic layers. In other words, tunneling magneto-resistance elements TMR and program cells PRC have an electric resistance Rmin.

Provided that tunneling magneto-resistance elements TMR of the normal memory cells and the magneto-resistance elements corresponding to program cells PRC1, PRC2 are arranged in the same direction and program cells PRC have electric resistance Rmin in the initial state (non-program state), a special step for magnetizing the program cells is not required. This simplifies the manufacturing process of the MRAM device.

Program circuit 100 includes control gates 150, 152, 160, 162 and voltage setting transistors 154, 155 and 164, 165. Control gates 150, 152, 160, 162 control the direction of a program current ±Iw(P) supplied to program bit lines PBL1, PBL2. Voltage setting transistors 154, 155 and 164, 165 are provided corresponding to program bit line PBL.

Control gate 150 outputs the NAND operation result of program data PDj that is programmed in the $j^{th}$ program unit (where j is an integer in the range of zero to k) and a program signal PRG that is activated to H level in program operation. Control gate 152 outputs the NAND operation result of an output signal of control gate 150 and a program signal PRG. Control gate 160 operates in the same manner as that of control gate 150. Like control gate 152, control gate 162 outputs the NAND operation result of an output of control gate 160 and a program signal PRG.

Voltage setting transistor 154 is a P-channel MOS transistor electrically coupled between one end of program bit line PBL1 and power supply voltage Vcc2. Voltage setting transistor 155 is an N-channel MOS transistor electrically coupled between one end of program bit line PBL1 and ground voltage Vss. Voltage setting transistor 164 is a P-channel MOS transistor electrically coupled between the other end of program bit line PBL1 and power supply voltage Vcc2. Voltage setting transistor 165 is an N-channel MOS transistor electrically coupled between the other end of program bit line PBL1 and ground voltage Vss.

Voltage setting transistors 154, 155 have their respective gates connected to the output of control gate 152. Voltage setting transistors 164, 165 have their respective gates connected to the output of control gate 160.

Voltage setting transistor 157 is a P-channel MOS transistor electrically coupled between one end of program bit line PBL2 and power supply voltage Vcc2. Voltage setting transistor 158 is an N-channel MOS transistor electrically coupled between one end of program bit line PBL2 and ground voltage Vss. Voltage setting transistor 167 is a P-channel MOS transistor electrically coupled between the other end of program bit line PBL2 and power supply voltage Vcc2. Voltage setting transistor 168 is an N-channel MOS transistor electrically coupled between the other end of program bit line PBL2 and ground voltage Vss.

Voltage setting transistors 157, 158 have their respective gates connected to the output of control gate 150. Voltage setting transistors 167, 168 have their respective gates connected to the output of control gate 162.

In operation other than program data write operation (program signal PRG is L level), the respective outputs of control gates 150, 152, 160, 162 are set to H level. Accordingly, both ends of each of program bit line PBL1 and program bit line PBL2 are coupled to ground voltage Vss. As shown in FIG. 11B, each program cell is connected between a MOS transistor and a program bit line. Therefore, connecting each program bit line to the ground voltage implements the circuit structure of current sense amplifiers 110, 120 in FIG. 7 in operation other than program data write operation.

On the other hand, in program data write operation (program signal PRG is H level), the output of control gate 150 is set to one of H level and L level, and the output of control gate 152 is set to the other level according to the level of program data PDj. In other words, the outputs of control gates 150, 152 are set in a complementary manner according to the level of program data PDj. Similarly, the outputs of control gates 160, 162 are set in a complementary manner. In this case, the outputs of control gates 150, 162 are set to the same level, and the outputs of control gates 152, 162 are set to the same level.

For example, when program data PDj is at H level, voltage setting transistors 155, 164 are turned ON and voltage setting transistors 154, 165 are turned OFF for program bit line PBL1. For program bit line PBL2, voltage setting transistors 157, 168 are turned ON and voltage setting transistors 158, 167 are turned OFF. As a result, a program current ±Iw(P) is supplied to program cells PRC1, PRC2 in the opposite directions, as shown by dashed arrows in the figure.

When program data PDj is at L level, each voltage setting transistor is turned ON/OFF in the opposite manner to that described above. As a result, a program current ±Iw(P) flows through program bit lines PBL1, PBL2 in the opposite manner to that in the case where program data PDj is at H level. More specifically, program current ±Iw(P) flows through program bit lines PBL1, PBL2 in the directions shown by solid arrow in the figure.

Program current ±Iw(P) generates a program magnetic field of the easy-axis direction for magnetizing program cells PRC1, PRC2 in the direction according to program data PDj. Note that, regardless of the level of program data PDj, the program current flows through program bit lines PBL1, PBL2 in the opposite directions. Therefore, in program data write operation, program cells PRC1, PRC2 are magnetized in the opposite directions along the easy axis.

Program circuit 100 further includes selection transistors 170 provided corresponding to program word lines PWL. Each selection transistor 170 receives an inverted signal /PRG of program signal PRG at its gate, and is electrically coupled between power supply voltage Vcc2 and one end of a corresponding program word line PWL. The other end of program word line PWL is coupled to ground voltage Vss. Accordingly, in program data write operation, a program current Ip(P) of a fixed direction is supplied to program word line PWL. Program current Ip(P) applies a program magnetic field of the hard-axis direction to each program cell PRC.

Program cells PRC receiving both program magnetic fields of the easy-axis direction and the hard-axis direction are magnetized so that program data PDj is written thereto.

Figures 13, 14:
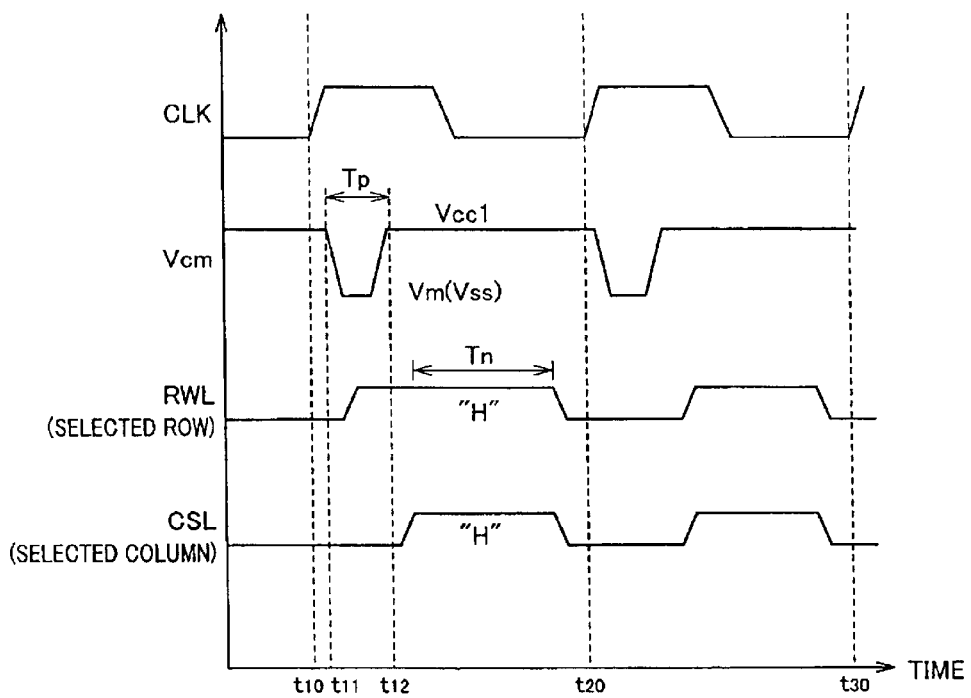
FIG. 13 illustrates input/output signals of program cells.
FIG. 14 is a waveform chart illustrating program data read operation according to a first modification of the first embodiment.

FIG. 13 illustrates input/output signals of the program cells.

Referring to FIG. 13, each program cell is set to the initial state in the step of magnetizing the fixed magnetic layers in the normal memory cells. In other words, electric resistances R1, R2 of program cells PRC1, PRC2 are set to Rmin. As described before, when program data is read in this state, program signals φa, φb output from the program units are set to L level and H level, respectively.

In program data write operation for storing program data (defective address bits) to the program units, program signal PRG is set to H level, and either program state 1 or program state 2 is applied according to the level of program data PDj. As a result, the magnetization direction of either program cell PRC1 or PRC2 changes from the initial state, and the electric resistance thereof varies to Rmax.

More specifically, in program state 1 where program data PDj is at L level, a program current is supplied so that electric resistance R2 of program cell PRC2 varies to Rmax. On the other hand, in program state 2 where program data PDj is at H level, a program current is supplied so that electric signal R1 of program cell PRC1 varies to Rmax.

When the program data is read from the program units having transitioned from the initial state to the program state by the program data write operation, program signal φa is set to H level and program signal φb is set to either H level or L level according to the program data level.

In the program units retained in the non-program state, that is, in the initial state, both program cells PRC1, PRC2 have electric resistance Rmin as in the initial state. Accordingly, when the program data is read from the program units in the non-program state, both program signals φa, φb are set to L level.

According to the first embodiment, both one-bit program data and information of whether the program unit stores program data or not are stored in the program unit by using the program cells capable of being fabricated and magnetized without requiring a special manufacturing process and a special magnetizing step. Moreover, such one-bit data and information can be rapidly read from the program unit by sensing a current.

Moreover, since the program units store information such as defective address bits for replacing a defective memory cell, the redundant replacement structure can be efficiently implemented.

First Modification of First Embodiment

Hereinafter, program data read operation according to a modification of the first embodiment will be described. This program data read operation assures operation reliability of the program cells.

Referring to FIG. 14, it is assumed that an instruction to conduct data read operation or data write operation is applied and a data read cycle or a data write cycle is started at time t10, t20 when clock signal CLK is activated. When the data write cycle is started, row selection operation and column selection operation are started according to an applied address signal.

When the MRAM device has a redundant structure, whether the applied address signal matches any one of defective addresses or not must be determined in row selection operation or column selection operation. Accordingly, in a prescribed period after the data read cycle or data write cycle is started (i.e., in a period between t11 and t12 in FIG. 14), control voltage Vcn equal to intermediate voltage Vm is applied to the program units in order to read program data, i.e., defective address bits, from each program unit. As a result, redundant control circuit 105 can conduct prescribed redundant replacement by using the defective addresses read from program circuit 100.

Since the defective addresses are read in every cycle, the program data is read from the program cells more frequently than the storage data is read from the normal memory cells and spare cells in memory array 10.

In normal data read operation, power supply voltage Vcc1 (the selected state of read word line RWL) is applied across both ends of tunneling magneto-resistance elements TMR of the normal memory cells and spare cells in memory array 10. In program data read operation, control voltage Vcn is set to intermediate voltage Vm, whereby a bias voltage around intermediate voltage Vm is applied across both ends of the program cells (Vcc1>Vm>Vss). This suppresses the amount of current passing through the program cells in program data read operation, enabling improvement in operation reliability of the program cells.

In each cycle, control voltage Vcn is set to power supply voltage Vcc1 after redundant determination using the defective addresses is completed (i.e., in a period between t12 and t20 in FIG. 14). In this period, no current passes through program cells PRC. In the case where redundant replacement is conducted on a column-by-column basis, read word line RWL and write word line WWL can be activated according to the row selection result regardless of the redundant determination result. Accordingly, a period Tn during which read word line (selected row) RWL is retained active in normal data read operation is longer than a period Tp during which control voltage Vcn is set to intermediate voltage Vm in program data read operation.

Accordingly, the voltage application time to the program cells in program data read operation is shorter than that to the normal memory cells and spare cells in normal data read operation. In other words, the period during which a current passes through the program cells in program data read operation is shorter than that during which a current passes through the normal memory cells and spare cells in normal data read operation. This enables improvement in operation reliability of the program cells.

Second Modification of First Embodiment

Figure 15:
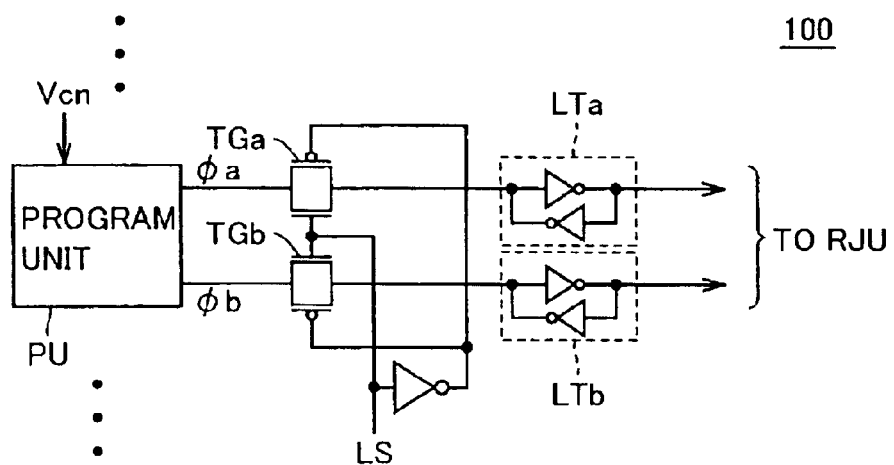
FIG. 15 is a block diagram showing the structure of a program circuit according to a second modification of the first embodiment.

Referring to FIG. 15, program circuit 100 according to the second modification of the first embodiment is different from that of FIG. 4 in that program circuit 100 of the second modification of the first embodiment includes for each program unit PU transfer gates TGa, TGb for storing program signals φa, φb and latch circuits LTa, LTb. Although not shown in the figure, transfer gates TGa, TGb and latch circuits LTa, LTb are similarly provided for each program unit PU.

Transfer gate TGa and latch circuit LTa are provided corresponding to program signal φa, and transfer gate TGb and latch circuit LTh are provided corresponding to program signal φb. Transfer gates TGa, TGb transmit program signals φa, φb to latch circuits LTa, LTb in the active (H level) period of a latch signal LS, respectively.

Latch circuits LTa, LTh latch program signals φa, φb transmitted through transfer gates TGa, TGb, respectively. Latch circuits LTa, LTb hold the latched data while the power is ON.

Since the structure of program circuit 100 is otherwise the same as that of the first embodiment, detailed description thereof will not be repeated.

Figure 16:
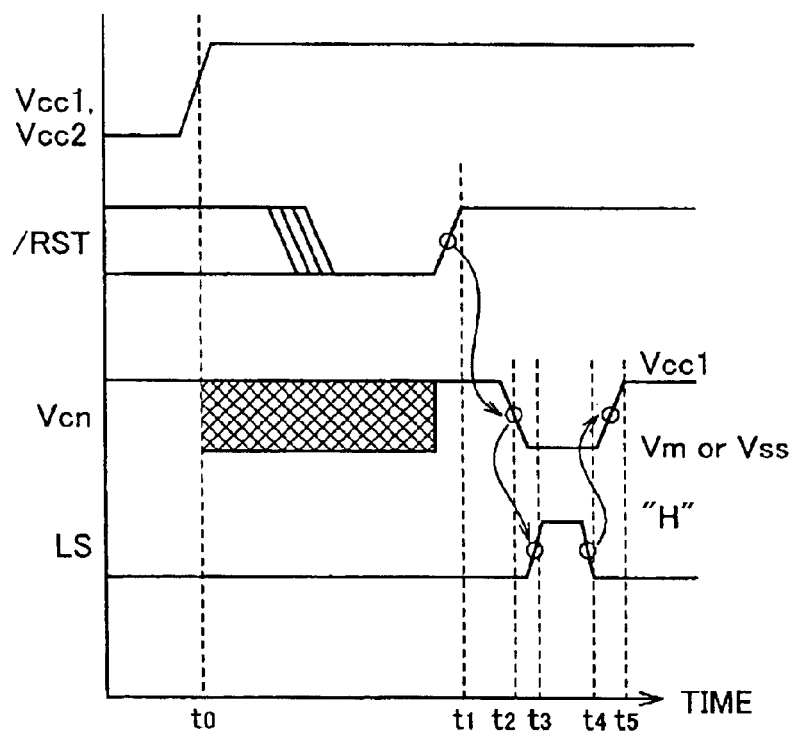
FIG. 16 is a waveform chart illustrating program data read operation according to the second modification of the first embodiment.

FIG. 16 is a waveform chart illustrating program data read operation according to the second modification of the first embodiment.

Referring to FIG. 16, at time t0, the power of the MRAM device is turned ON, raising power supply voltages Vcc1, Vcc2. After a prescribed time from the power-ON (i.e., at time t1), a reset signal /RST rises to H level, and a startup sequence is conducted.

Program data read operation from each program cell, that is, operation of reading defective addresses, is triggered by the power-ON and is conducted as a part of the startup sequence. In response to the rise of reset signal /RST, control voltage Vcn is set to intermediate voltage Vm (or ground voltage Vss) at time t2. As a result, program data is read from each program unit, whereby each program unit outputs program signals φa, φb according to the program data (defective address bit). Latch signal LS is activated to H level in a prescribed period (i.e., a period between t3 and t4). This prescribed period is determined according to the timing when setting of program signals φa, φb is completed. As a result, program signals φa, φb read from each program unit are held in latch circuits LTa, LTb until the power is turned OFF.

Once program signals φa, φb are read and latched in latch circuits LTa, LTb, control voltage Vcn is set to power supply voltage Vcc1 at time t5 or later. Thereafter, in every data read cycle or every data write cycle of the normal operation, redundant determination using the defective addresses is conducted based on the data in latch circuits LTa, LTb.

In the above structure, a current passes through the program cells only in a short period within the startup sequence that is triggered by power-ON. Accordingly, operation reliability of the program cells can be improved even when information (such as defective addresses) that must be referred to in every cycle in normal operation is programmed.

Second Embodiment

Figure 17:
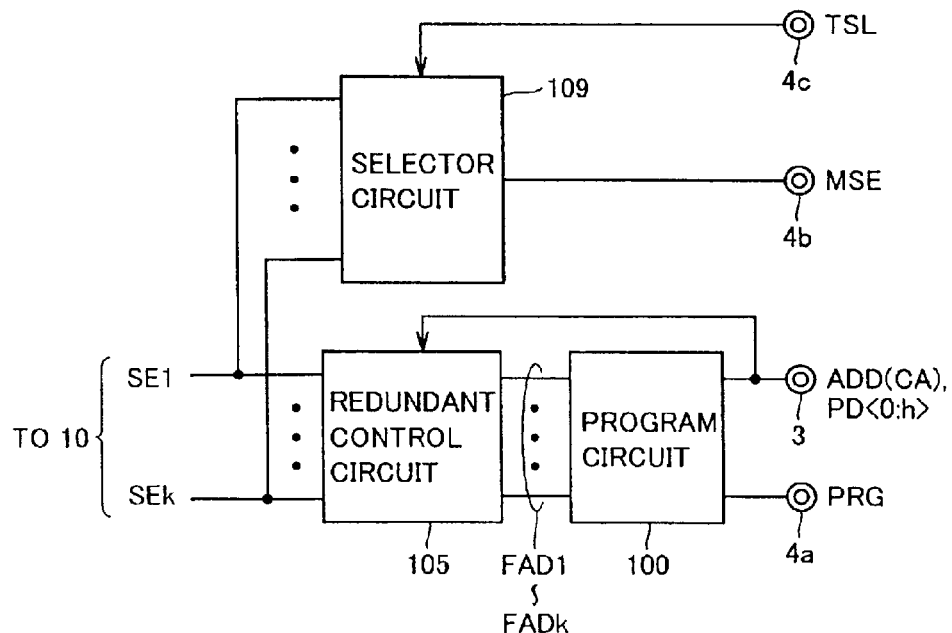
FIG. 17 is a block diagram of the circuit structure associated with inputting/outputting of program data according to a second embodiment of the present invention.

FIG. 17 shows the circuit structure associated with inputting/outputting of program data according to the second embodiment of the present invention Referring to FIG. 17, a monitor terminal 4b is further provided in the second embodiment. Monitor terminal 4b is provided in order to monitor from the outside the redundant determination result that is obtained in redundant control circuit 105 based on the defective addresses programmed in program circuit 100.

A selector circuit 109 receives spare enable signals SE1 to SEk from redundant control circuit 105, and selectively outputs one of spare enable signals SE1 to SEk to monitor terminal 4b according to a test selection signal TSL applied to a signal terminal 4c. The use of such additional two terminals enables the redundant determination result of redundant control circuit 105 to be monitored from the outside.

For example, in operation test, an address signal ADD corresponding to a defective address programmed in program circuit 100 is applied and spare enable signals SE1 to SEk are then monitored. As a result, whether the defective address is properly stored in program circuit 100 or not can be confirmed efficiently.

Alternatively, selector circuit 109 may be replaced with k monitor terminals so that spare enable signals SE1 to SEk can be monitored in parallel from the outside.

Third Embodiment

In the third embodiment, the structure for efficiently supplying a program current will be described.

Figure 18:
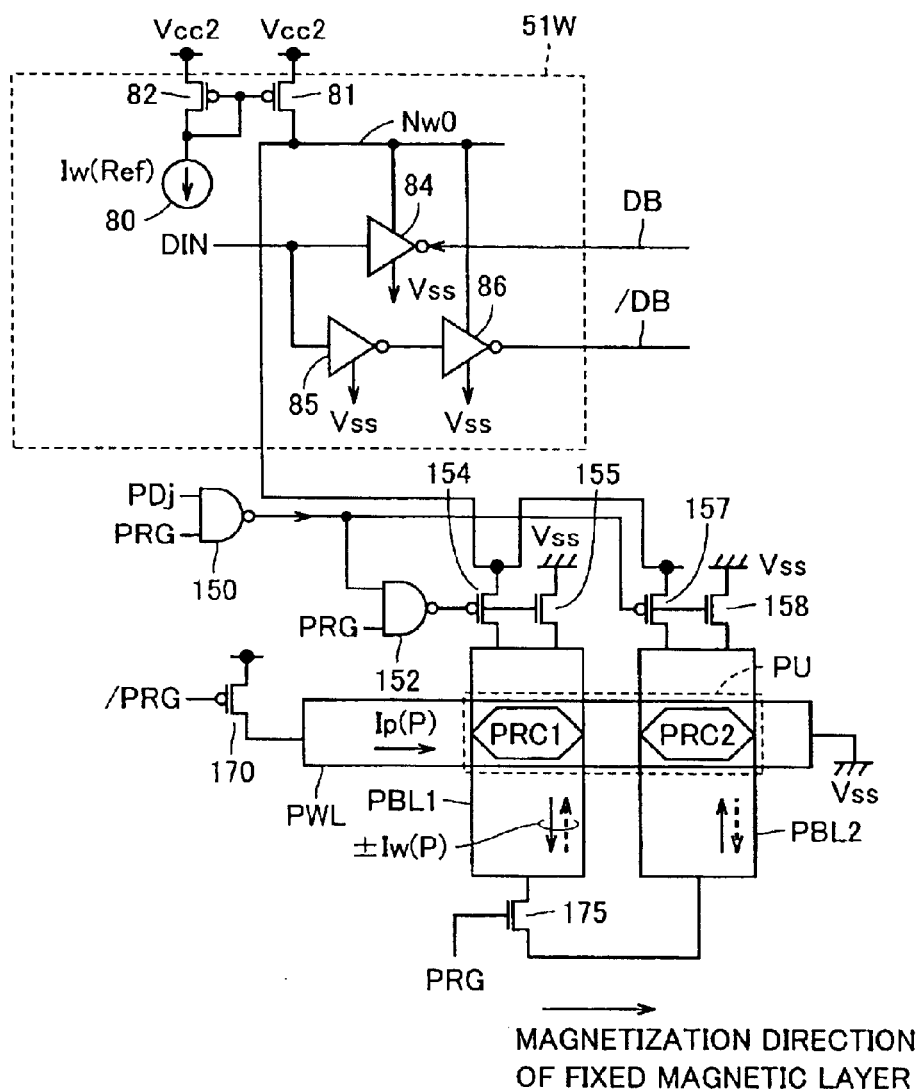
FIG. 18 is a circuit diagram showing a first example of the structure for supplying a program current according to a third embodiment of the present invention.

FIG. 18 is a circuit diagram showing a first example of the structure for supplying a program current according to the third embodiment.

Referring to FIG. 18, a data write circuit 51W for supplying a data write current ±Iw of a normal memory cell includes a current supply circuit 80 for supplying a prescribed current Iw(Ref) and P-channel MOS transistors 81, 82. P-channel MOS transistors 81, 82 forms a current mirror. A current supplied to an internal node Nw0 is set according to prescribed current Iw(Ref).

Data write circuit 51W further includes inverters 84, 85, 86 operating with an operating current received through internal node Nw0. Inverters 84, 85, 86 operate with power supply voltage Vcc2 and ground voltage Vss.

Inverter 84 inverts the voltage level of write data DIN for output to data bus DB. Inverter 85 inverts the voltage level of write data DIN for output to an input node of inverter 86. Inverter 86 inverts the output of inverter 85 for output to data bus /DB. Accordingly, data write circuit 51W sets the voltage on data bus DB to one of power supply voltage Vcc2 and ground voltage Vss and sets the voltage on data bus /DB to the other voltage according to the voltage level of write data DIN.

In the first example of the third embodiment, the structure for supplying a program current ±Iw(P) to program bit lines PBL1, PBL2 is different from that of FIG. 12 in that voltage setting transistors 154, 157 are electrically coupled between internal node Nw0 of data write circuit 51W and one end of program bit lines PBL1, PBL2, respectively.

When program cells PRC are designed with the same shape and the same magnetization characteristics as those of tunneling magneto-resistance elements TMR of the normal memory cells and spare memory cells, the amount of program current ±Iw(P) can be set to the same value as that of data write current ±Iw for the normal memory cells. Accordingly, by using current supply circuit 80 of data write circuit 51W, an optimal program current can be supplied without increasing the circuit area.

In the structure of FIG. 18, control gates 160, 162 and voltage setting transistors 164, 165, 167, 168 in FIG. 12 are replaced with a transistor switch 175. A program signal PRG is applied to the gate of transistor switch 175. Since the structure of FIG. 18 is otherwise the same as that of FIG. 12, detailed description thereof will not be repeated.

As described before, in program data write operation, a current is applied to program bit lines PBL1, PBL2 in the opposite directions regardless of the level of program data PDj.

Accordingly, provided that one ends of program bit lines PBL1, PBL2 are coupled to power supply voltage Vcc or ground voltage Vss according to the level of program data PDj, the same program current as that described in FIG. 12 can be supplied by merely electrically coupling the other ends of program bit lines PBL1, PBL2 to each other by transistor switch 175. This enables reduction in area of the program circuit.

Note that, in the structure of FIG. 12 as well, control gates 160, 162 and voltage setting transistors 164, 165, 167, 168 may be replaced with transistor switch 175.

Figure 19:
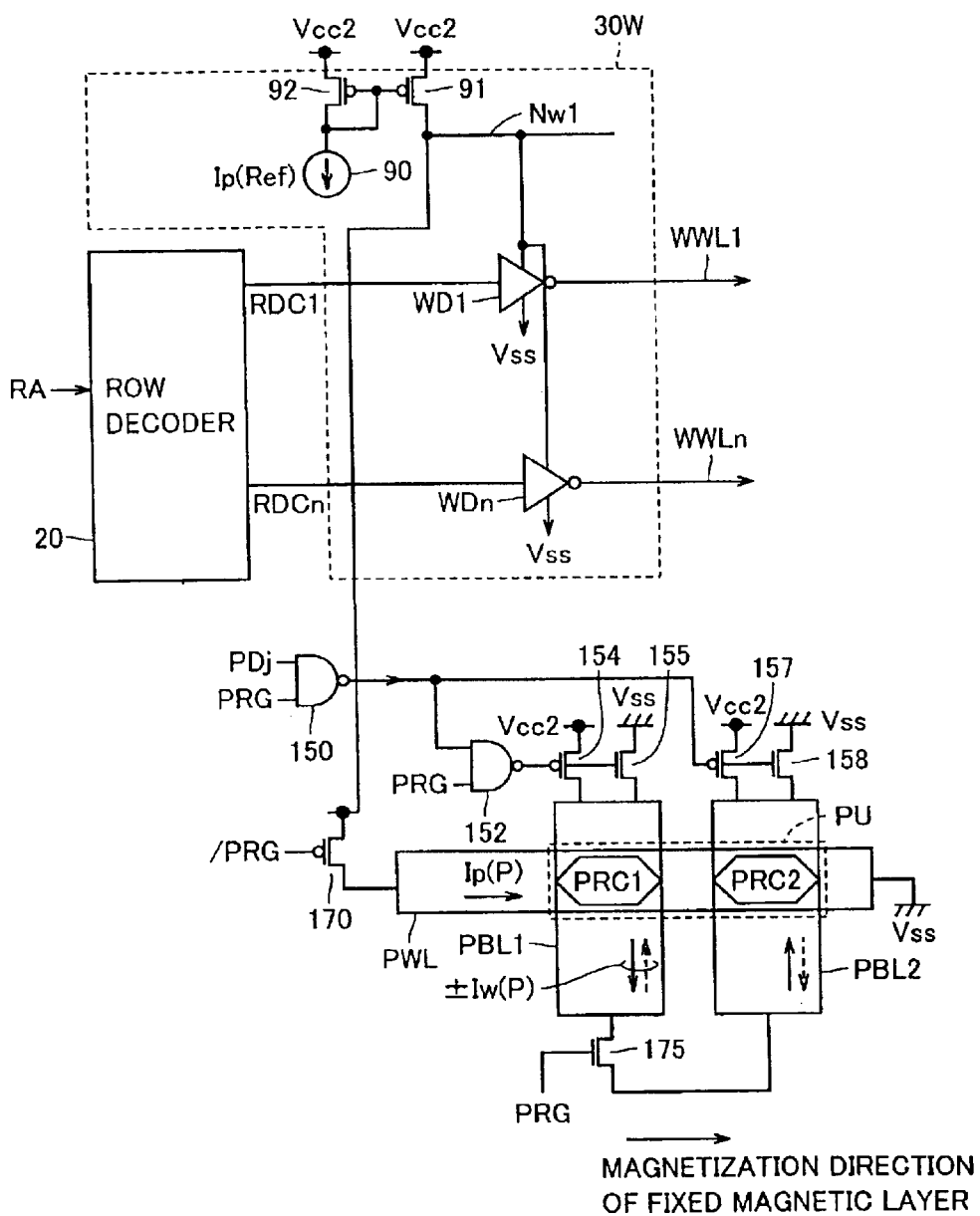
FIG. 19 is a circuit diagram showing a second example of the structure for supplying a program current according to the third embodiment.

FIG. 19 is a circuit diagram showing a second example of the structure for supplying a program current according to the third embodiment.

Referring to FIG. 19, word line driver 30 includes a write word line drive portion 30W for controlling activation of write word line WWL. Write word line drive portion 30W includes a current supply circuit 90 for supplying a prescribed current Ip(Ref), a current defining a data write current Ip of the normal memory cells, and P-channel MOS transistors 91, 92. P-channel MOS transistors 91, 92 form a current mirror. A current supplied to an internal node Nw1 is set according to prescribed current Ip(Ref).

Write word line drive portion 30W further includes drive units WD1 to WDn provided corresponding to write word lines WWL1 to WWLn. Each drive unit WD1 to WDn is an inverter that operates with an operating current received through internal node Nw1. Each drive unit WD1 to WDn operates with power supply voltage Vcc2 and ground voltage Vss.

Row decoder 20 activates one of row decode signals RDC1 to RDCn corresponding to the selected row to L level according to row address RA. In response to this, one of drive units WD1 to WDn corresponding to the selected row activates a corresponding write word line WWL to the selected state (H level: power supply voltage Vcc2).

In the second example of the third embodiment, the structure for supplying a program current Ip(P) to program bit lines PBL1, PBL2 is different from that of FIG. 12 in that selection transistor 170 is electrically coupled between internal node Nw1 of write word line drive portion 30W and program word line PWL. Since the structure is otherwise the same as that of FIG. 12, detailed description thereof will not be repeated.

For program bit lines PBL1, PBL2, control gates 160, 162 and voltage setting transistors 164, 165, 167, 168 in FIG. 12 are replaced with a transistor switch 175, as in the structure of FIG. 18.

When program cells PRC are designed with the same shape and the same magnetization characteristics as those of tunneling magneto-resistance elements TMR of the normal memory cells and spare memory cells, the amount of program current ±Ip(P) can be set to the same value as that of data write current Ip for the normal memory cells. Accordingly, by using current supply circuit 90 of write word line drive portion 30W, an optimal program current can be supplied without increasing the circuit area.

Fourth Embodiment

In the fourth embodiment, the structure for efficiently arranging a plurality of program cells will be described.

Figure 20:
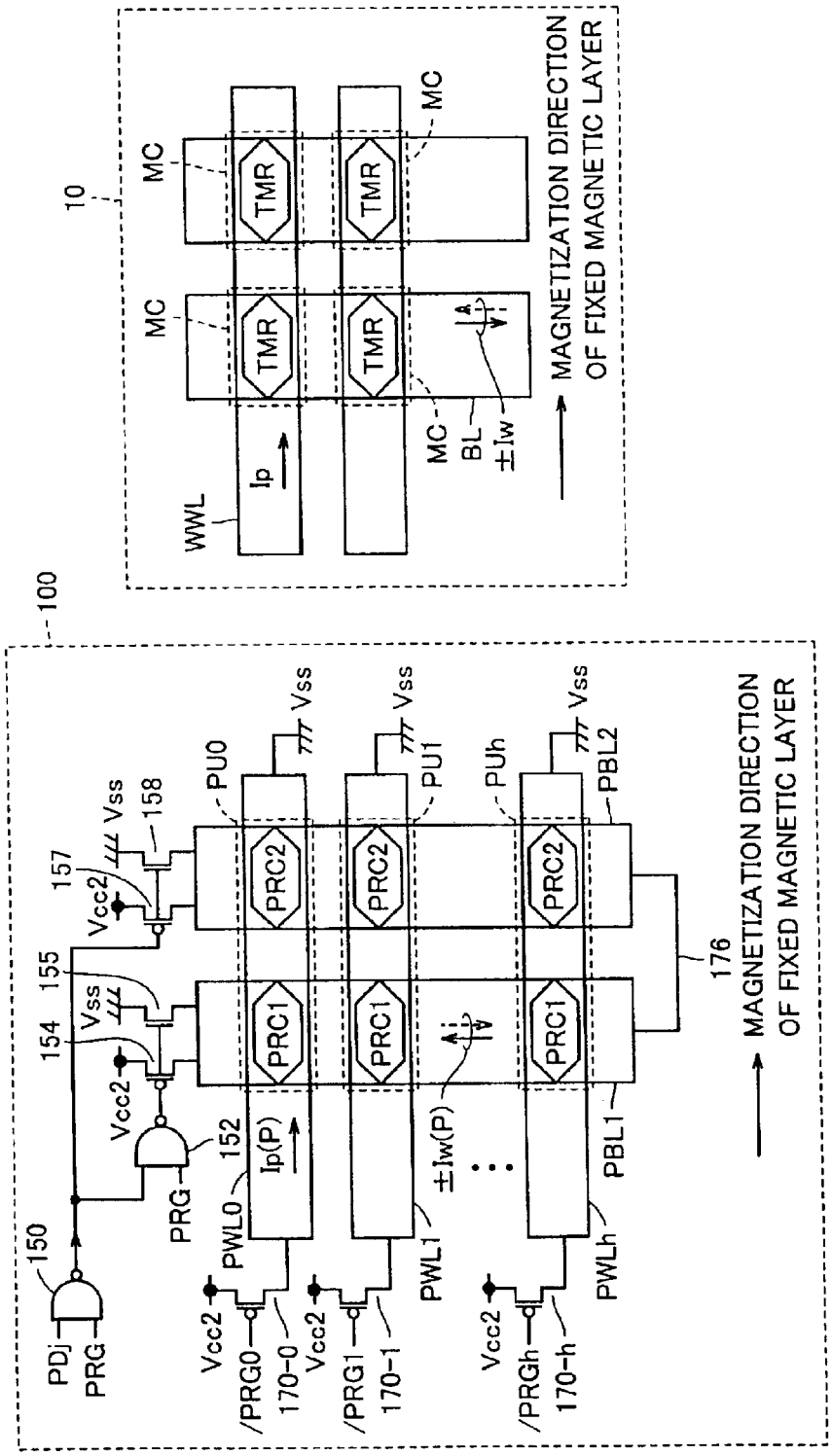
FIG. 20 is a circuit diagram showing the arrangement of program cells according to a fourth embodiment of the present invention.

FIG. 20 is a circuit diagram showing the arrangement of program cells according to the fourth embodiment.

FIG. 20 shows only some of a plurality of program cells in program circuit 100. More specifically, FIG. 20 shows the arrangement of the program cells corresponding to program units PU0 to PUh each storing a corresponding bit of the same defective address.

In each program unit PU0 to PUh, program cells PRC1, PRC2 are electrically coupled to a pair of program bit lines PBL1, PBL2, respectively.

Program word lines PWL0 to PWLh are provided corresponding to program units PU0 to PUh. The program cells of the same program unit correspond to the same program word line PWL.

Selection transistors 170-0 to 170-h are provided between power supply voltage Vcc2 and program word lines PWL0 to PWLh, respectively. Program signals /PRG0 to /PRGh corresponding to program units PU1 to PUh are respectively applied to the gates of selection transistors 170-0 to 170-h. Program signal /PRG0 to /PRGh is activated to L level when a corresponding program unit PU is selected for program data write operation. Accordingly, in the program unit selected for program data write operation, a program current Ip(P) is supplied to each program cell PRC1, PRC2.

The structure for supplying a program current ±Iw(P) to the pair of program bit lines PBL1, PBL2 is different from that of FIGS. 18, 19 in that transistor switch 175 is replaced with a connection 176 formed by, e.g., a metal wiring. As in this structure, even when transistor switch 175 is eliminated and program bit lines PBL1, PBL2 are always electrically coupled together at the other ends, supply of program current ±Iw(P) in program data write operation and setting of voltages for program bit lines PBL1, PBL2 in operation other than the program data write operation can be conducted in the same manner as that of FIGS. 12, 18, 19. In the structures of FIGS. 12, 18, 19 as well, program bit lines PBL1, PBL2 can be electrically coupled together at the other ends by using connection 176 instead of the transistor.

The above structure allows the program cells to be efficiently arranged in a matrix and allows the program data write operation according to program data PDj to be conducted for every program unit.

Fifth Embodiment

The program units of the first to fourth embodiments for storing program data for use in redundant programming must have sufficiently higher operation reliability than that of the memory cells for normal data storage. In the fifth embodiment, the structure of the program unit having high operation reliability will be described Referring to FIG. 21, a program cell PRC1 in a program unit PU# of the fifth embodiment includes a plurality of magneto-resistance elements connected in series between N-channel MOS transistor 113 and ground voltage Vss. These magneto-resistance elements are the same as tunneling magneto-resistance elements TMR. Similarly, a program cell PRC2 in program unit PU# includes a plurality of magneto-resistance elements connected in series between N-channel MOS transistor 123 and ground voltage Vss.

Figure 21:
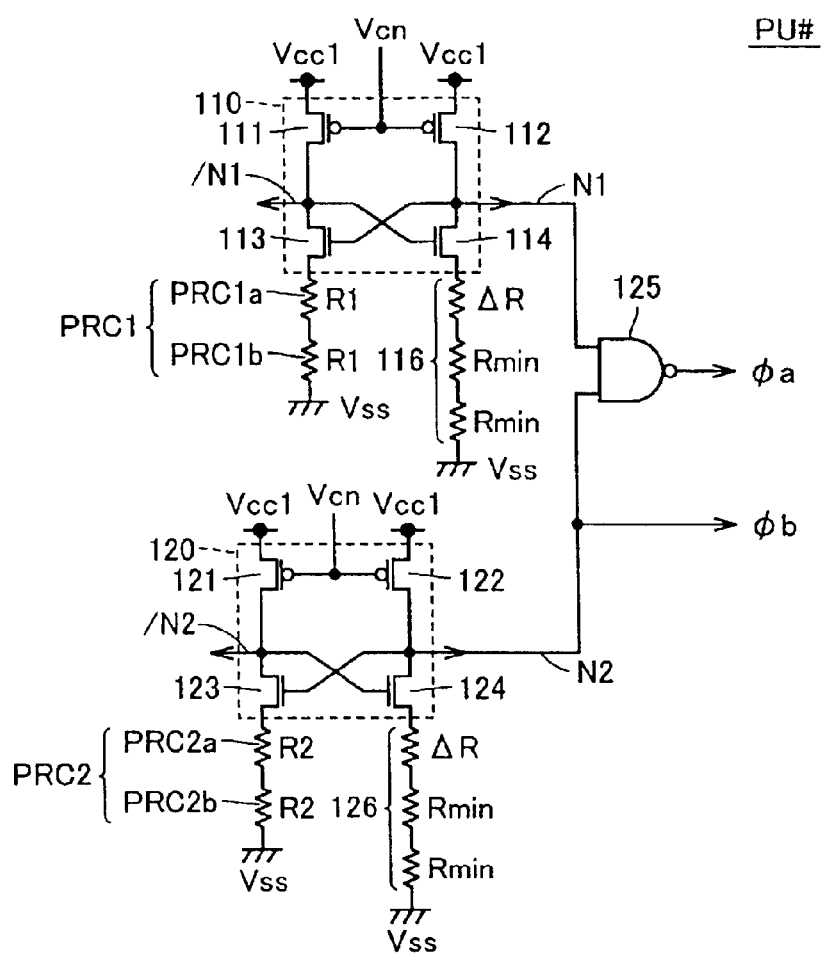
FIG. 21 is a circuit diagram showing the structure of program cells according to a fifth embodiment of the present invention.

In the example of FIG. 21, each program cell PRC is formed from two magneto-resistance elements. More specifically, program cell PRC1 includes series-connected magneto-resistance elements PRC1$a$, PRC1$b$, and program cell PRC2 includes series-connected magneto-resistance elements PRC2$a$, PRC2$b$. Magneto-resistance elements PRC1$a$, PRC1$b$, PRC2$a$, PRC2$b$ have the same structure as that of program cells PRC1, PRC2 in FIG. 7.

In the fifth embodiment, the respective electric resistances of program cells PRC1, PRC2 are set to either (2×Rmin) or (2×Rmax). Therefore, reference resistors 115, 125 are replaced with reference resistors 116, 126. Each reference register 116, 126 has an electric resistance of (2×Rmin+ΔR). The structure of program unit PU# is otherwise the same as that of program unit PU0 in FIG. 7, detailed description thereof will not be repeated.

The above structure suppresses the amount of current passing through each magneto-resistance element in the program cell in program data read operation, and thus enables improvement in operation reliability of the program cells.

Figure 22:
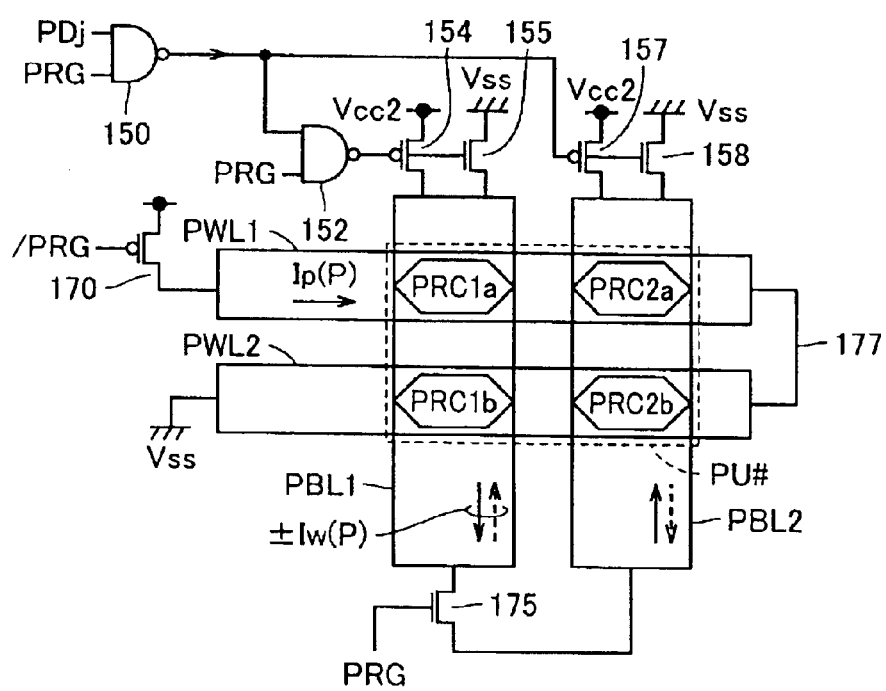
FIG. 22 is a circuit diagram illustrating supply of a program current to the program cells according to the fifth embodiment.

FIG. 22 is a circuit diagram illustrating supply of a program current to the program cells according to the fifth embodiment.

Referring to FIG. 22, magneto-resistance element PRC1$a$ of program cell PRC1 is provided at the intersection of program word line PWL1 and program bit line PBL1. Magneto-resistance element PRC1$b$ is provided at the intersection of program word line PWL2 and program bit line PBL1.

Similarly, magneto-resistance element PRC2$a$ of program cell PRC2 is provided at the intersection of program word line PWL1 and program bit line PBL2. Magneto-resistance element PRC2$b$ is provided at the intersection of program word line PWL2 and program bit line PBL2.

The same structure as that described in FIGS. 18 and 19 is used to supply a program current ±Iw(P) to a pair of program bit lines PBL1, PBL2 according to program data PDj. Note that, as shown in FIG. 20, transistor switch 175 may be replaced with connection 176 formed from a metal wiring or the like.

Program word lines PWL1, PWL2 corresponding to the same program unit are provided in pairs. Each pair of program word lines PWL1, PWL2 is electrically coupled together at one ends by a connection 177. Connection 177 is formed from a metal wiring or the like. The other end of one program word line PWL1 is connected to power supply voltage Vcc2 through selection transistor 170. The other end of the other program word line PWL2 is connected to ground voltage Vss. In response to activation of a program signal /PRG applied to selection transistor 170, a program current Ip(P) of a fixed direction is supplied to program word lines PWL1, PWL2 as a reciprocating current. As a result, a program magnetic field of the hard-axis direction can be applied to each magneto-resistance element.

Moreover, a program current ±Iw(P) is applied to program bit lines PBL1, PBL2 according to program data PDj, and generates a program magnetic field of the easy-axis direction. With this program magnetic field, the magneto-resistance elements of the same program cell can be magnetized in the same direction and the magneto-resistance elements of different program cells can be magnetized in different directions. As a result, the program data write operation can be conducted in the same manner even for the program cells having high operation reliability according to the fifth embodiment.

Sixth Embodiment

In the sixth embodiment, another example of the structure of a program unit having a high operation margin and high operation reliability will be described.

Figures 23, 24:
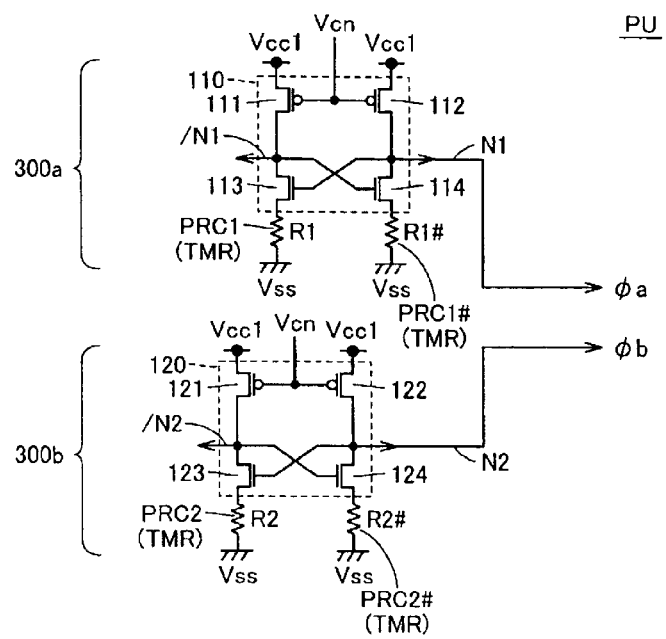

Referring to FIG. 23, the program unit of the sixth embodiment is different from that of the first embodiment in FIG. 7 in that reference resistors 115, 125 are replaced with program cells PRC1#, PRC2#. Like program cells PRC1, PRC2, each program cell PRC1#, PRC2# has the same shape and structure as those of tunneling magneto-resistance element TMR of memory cell MC. Program cell PRC1# is connected between transistor 114 in current sense amplifier 110 and ground voltage Vss. Similarly, program cell PRC2# is connected between transistor 124 in current sense amplifier 120 and ground voltage Vss.

Logic gate 130 (EX-OR gate) in FIG. 7 is eliminated. The voltage levels on nodes N1, N2 correspond to program signals $\phi$a, $\phi$b, respectively. In other words, program unit PU includes a program register 300$a$ for storing a one-bit signal corresponding to program signal $\phi$a, and a program register 300$b$ for storing a one-bit signal corresponding to program signal $\phi$b.

In program data read operation, control voltage Vcn is set to intermediate voltage Vm (Vss<Vm<Vcc). In response to this, current sense amplifier 110 in program register 300$a$ applies a bias voltage across both ends of each program cell PRC1, PRC1# according to control voltage Vcn. Current sense amplifier 110 then obtains the difference between currents passing through program cells PRC1, PRC1#, that is, compares electric resistances R1, R1# with each other. Current sense amplifier 110 then produces a program signal $\phi$a according to the comparison result. Program signal $\phi$a indicates whether a corresponding program unit is in the non-program state or the program state. Similarly, current sense amplifier 120 in program register 300$b$ applies a bias voltage across both ends of each program cell PRC2, PRC2# according to control voltage Vcn. Current sense amplifier 120 then obtains the difference between currents passing through program cells PRC2, PRC2#, that is, compares electric resistances R2, R2# with each other. Current sense amplifier 120 then produces a program signal $\phi$b according to the comparison result. Program signal $\phi$b indicates the level of program data stored in a corresponding program unit in the program state.

FIG. 24 shows the relation between the electric resistance of the program cells in the program unit, the state of the program unit and the like according to the sixth embodiment.

Referring to FIG. 24, in the initial state, program cells PRC1, PRC1# of program register 300$a$ are magnetized in the opposite directions. Electric resistance R1 of program cell PRC1 is set to Rmax, and electric resistance R1# of program cell PRC1# is set to Rmin. On the other hand, program cells PRC2, PRC2# of program register 300$b$ are magnetized in the same direction. For example, electric resistances R2, R2# thereof are set to Rmin.

In the program state, each program cell PRC1, PRC1# of program register 300$a$ is magnetized in the direction opposite to that in the initial state. Therefore, electric resistance R1 is set to Rmin, and electric resistance R1# is set to Rmax. On the other hand, program cells PRC2, PRC2# of program register 300b are magnetized in different directions, and complementary data are written thereto. In other words, either program cell PRC2 or PRC2# is magnetized in the direction different from that in the initial state. Which one of program cells PRC2 or PRC2# is magnetized in the direction different from that in the initial state is determined according to the program data to be written.

More specifically, in program data write operation, one of the following two data write operations is selectively conducted according to the program data to be written: the magnetization direction of program cell PRC2 is changed and the magnetization direction of program cell PRC2# is retained in the same direction as in the initial state (R2= Rmax, R2#=Rmin: "program state 1"); and the magnetization direction of program cell PRC2# is changed and the magnetization direction of program cell PRC2 is retained in the same direction as in the initial state (R2=Rmin, R2#= Rmax: "program state 2").

In a program cell that is not subjected to program data write operation, that is, a program cell in the non-program state, the magnetization directions of program cells PRC1, PRC1#, PRC2, PRC2#, that is, the electric resistances thereof, are the same as those in the initial state.

Hereinafter, the level of program signals in program data read operation and program data write operation from and to the program unit of the sixth embodiment will be described with reference to FIGS. 25A, 25B and 25C.

Figure 25A:
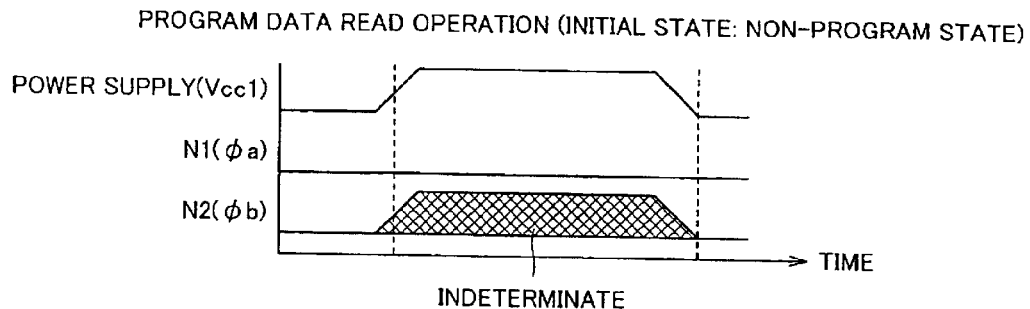
FIGS. 25A, 25B and 25C are waveform charts illustrating the level of program signals in program data read operation and program data write operation from and to the program unit of FIG. 23.

Referring to FIG. 25A, in the initial state, electric resistance R1 of program cell PRC1 in program register 300a is higher than electric resistance R1# of program cell PRC1#. Therefore, in program data read operation, the voltage on node N1, that is, program signal φa, is set to L level indicating the non-program state. In program register 300b, however, electric resistances R2, R2# of program cells PRC2, PRC2# have the same level. Therefore, the voltage on node N2, that is, program signal φb, is indeterminate in the program data read operation. If a program signal φa corresponding to that program signal φb is at L level and indicates the non-program state, that program signal φb is not significant. Therefore, such an indeterminate program signal φb does not have any adverse effects.

Figure 25B:
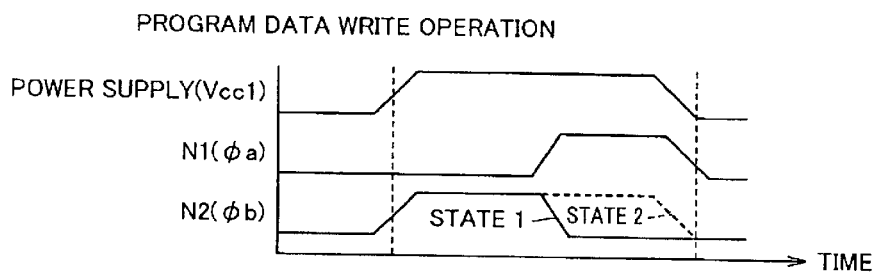

Referring to FIG. 25B, in program data write operation, the relation between electric resistances R1, R1# of program cells PRC1, PRC1# in program register 300a is reversed from that described above. Therefore, program signal a rises from L level indicating the non-program state to H level indicating the program state. In program register 300b, program data write operation of either program state 1 or program state 2 is conducted according to the program data level to be written, and complementary data are written to program cells PRC2, PRC2#. As a result, when program data write operation of program state 1 (R2=Rmax, R2#=Rmin) is conducted, program signal φb from program register 300b is set to L level. When program data write operation of program state 2 (R2=Rmin, R2#=Rmax) is conducted, program signal φb from program register 300b is set to H level.

Figure 25C:
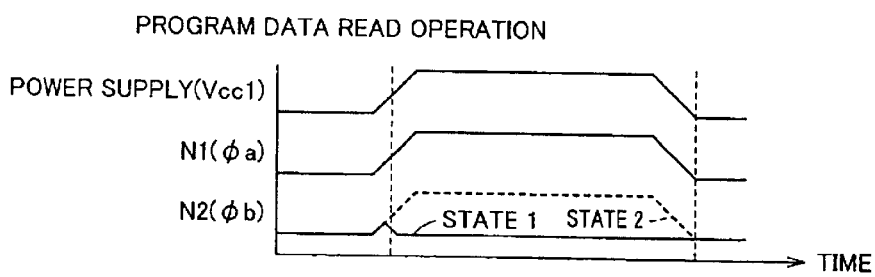

FIG. 25C illustrates program data read operation from the program unit in the program state. In program data read operation, a prescribed bias voltage is applied to each program cell according to control voltage Vcn, and program signals φa, φb are generated by current sense amplifiers 110, 120. In the program unit in the program state, program signal φb indicates whether the program unit is in program state 1 or program state 2, that is, indicates the level of one-bit program data stored therein. Program signal φa is set to H level regardless of whether the program unit is in program state 1 or program state 2, that is, regardless of the level of one-bit program data stored therein.

According to the sixth embodiment, each program register 300a, 300b stores a one-bit program signal by using two program cells, that is, twin-cell structure. As shown in FIG. 2, each memory cell MC stores one-bit data by using a single tunneling magneto-resistance element TMR, that is, single-cell structure.

Accordingly, each program register in the program circuit serving as a unit for storing a one-bit program signal has higher reliability than that of the memory cell for normal data storage. As a result, the program units will not malfunction as long as the memory cells operate properly, whereby stable operation of the MRAM device will be assured.

In the circuit structure of FIG. 23, control voltage Vcn to be applied to current sense amplifiers 110, 120 may be adjusted so that the voltage applied across both ends of each program cell in program data read operation, that is, the electric field applied to the tunneling film in each program cell, becomes smaller than that applied across both ends of tunneling magneto-resistance element TMR of each memory cell in normal data read operation (i.e., the magnetic field applied to the tunneling film). This allows the program registers to have higher reliability than that of the memory cells for normal data storage. Note that the control voltage can be set in the same manner even when the sixth embodiment is combined with any of the first to fourth embodiments.

In particular, the use of the structure of the second modification of the first embodiment (program read operation is conducted upon power-ON and the result of the program read operation is held in the latch circuits) reduces the need for high-speed data read operation from the program units. Therefore, in such a structure, it is preferable to give top priority to the operation reliability of the program units. In other words, it is preferable to reduce a voltage applied across both ends of each program cell (i.e., bias voltage) to reduce an electric field applied to the tunneling film.

Like the fifth embodiment of FIG. 21, each program cell in FIG. 23 may be formed from a plurality of series-connected tunneling magneto-resistance elements TMR. This enables further improvement in operation reliability of the program cells.

Figure 26:
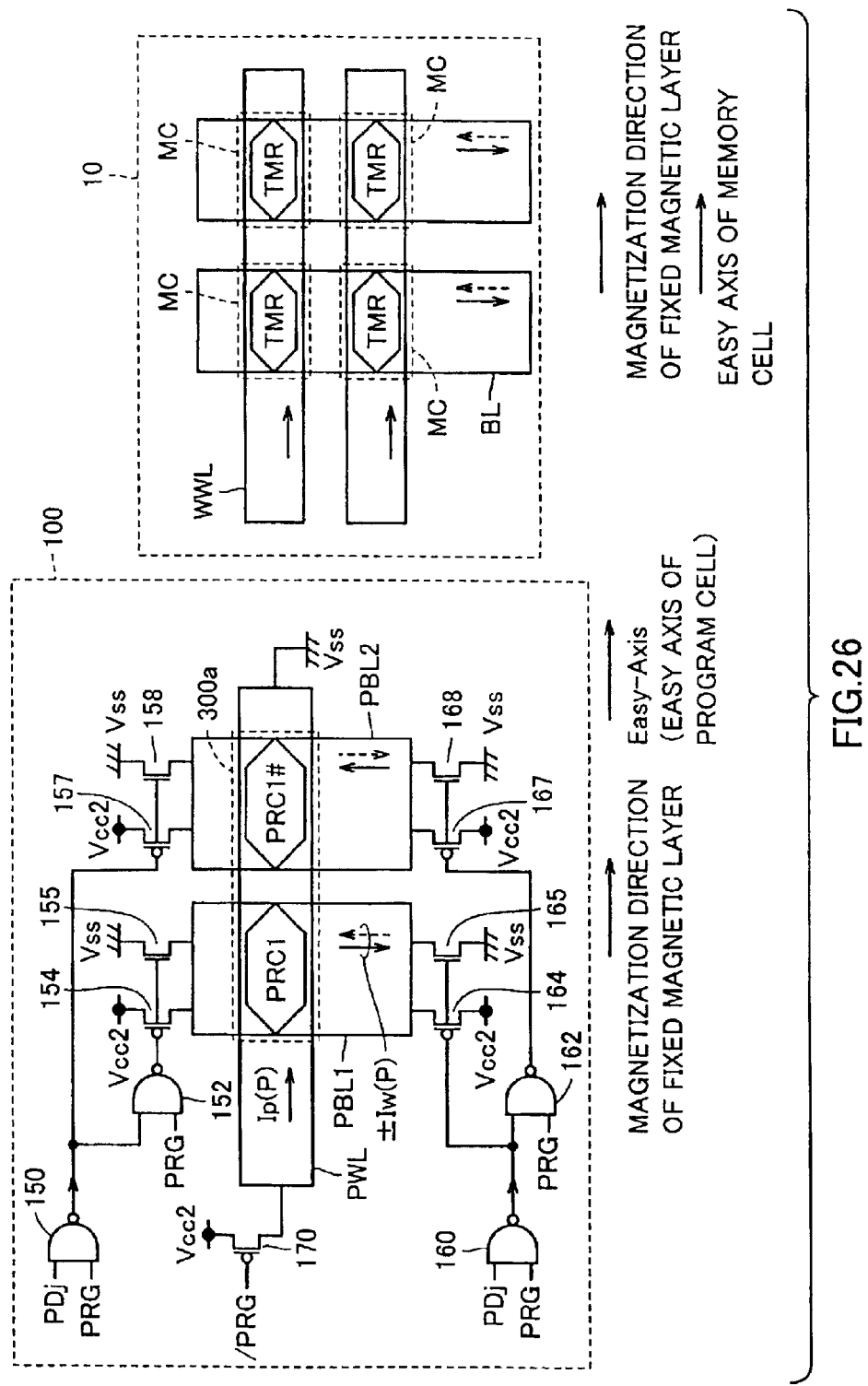
FIG. 26 is a circuit diagram showing another example of the structure of the program unit according to the sixth embodiment.

Alternatively, as shown in FIG. 26, each tunneling magneto-resistance element provided as a program cell in a program register may have a greater area than that of tunneling magneto-resistance element TMR in memory cell MC. In this case, a current passes through a greater area in the program cell in program data read operation than that in tunneling magneto-resistance element TMR in memory cell MC. As a result, each program cell has a lower electric resistance than that of memory cell MC.

With the above structure, even when the bias voltage applied across both ends of each program cell is the same as that applied across both ends of each memory cell, the difference in passing currents caused by the difference in magnetization direction (that is, by the difference in storage data level) is greater in the program cells than in the memory cells. As a results, a read operation margin of the program cells is greater than that of memory cells MC, thereby enabling the program registers to have higher reliability than that of the memory cells for normal data storage.

Seventh Embodiment

In the first to sixth embodiments, the program data for use in redundant replacement or the like is stored in the program cells having the same structure as that of the MTJ memory cells. In this case, the program data can be stored in a non-volatile manner and is rewritable a plurality of times. In the seventh embodiment, a programming method in the MRAM device will be described. It is herein assumed that program information is stored in such program cells.

Figure 27:
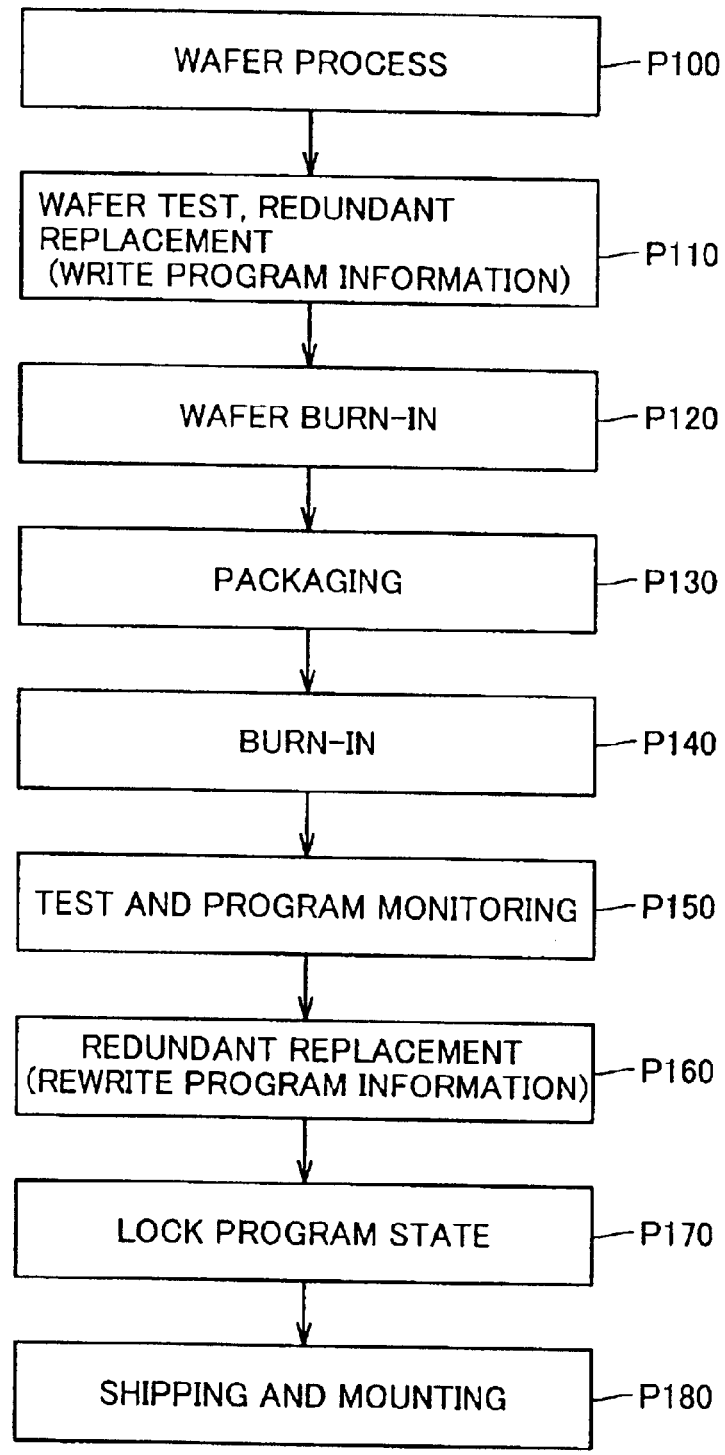
FIG. 27 is a flowchart illustrating a method for programming program information in an MRAM device according to a seventh embodiment of the present invention.

FIG. 27 is a flowchart illustrating a method for programming program information in the MRAM device according to the seventh embodiment.

Referring to FIG. 27, after a wafer process for fabricating a wafer (process P100) is completed, the MRAM device is subjected to wafer test, and program information for use in replacement of the defective memory cells detected in the wafer test is written to the program circuit (process P110). Thereafter, the MRAM device in the wafer state is subjected to burn-in test for accelerating manifest initial defects (process P120). After the burn-in test is completed, the MRAM device is packaged (process P130).

After the packaging process is completed, the packaged MRAM device is again subjected to burn-in test (process P140). After the burn-in test is completed, the MRAM device is subjected to final operation test. In this operation test, the program data stored in each program unit, that is, the program information written in process P110, is monitored and verified from the outside (process P150).

Such a program monitoring function can be realized by program circuit 100 having the structure of the second embodiment in FIG. 17. More specifically, in the operation test, an address signal ADD corresponding to each defective address programmed in program circuit 100 is applied and spare enable signals SE1 to SEk are monitored. In this way, whether the defective addresses are properly stored in program circuit 100 or not can be efficiently confirmed.

The final defective memory cells obtained in process P150 are replaced again (process P160). In other words, the program information stored in program circuit 100 can be rewritten in this process. Non-volatile storage data in the MTJ memory cells can be arbitrarily rewritten by application of a magnetic field. By using such characteristics of the MTJ memory cells, the program information written before the packaging process can be rewritten after the packaging process. As a result, the program information corresponding to the final test result conducted after the packaging process can be stored in a non-volatile manner.

After process P160 is completed, program information to be finally stored in the program circuit, that is, program signals of each program register, is determined. In order to prevent the storage data in the program registers from being rewritten later by accident, the program state is locked in at least one of the program registers so that the storage data therein is fixed in an irreversible manner (process P170). After the program state is locked, the MRAM device is shipped and mounted (process P180).

Hereinafter, the structure for implementing the function to lock the program state in process P170 will be described.

Figure 28:
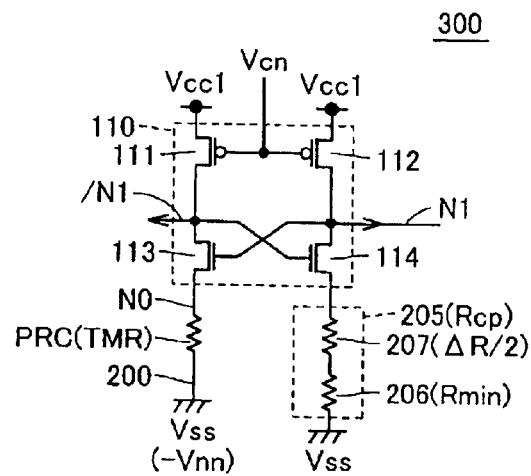
FIG. 28 is a circuit diagram illustrating the structure of a program register having a function to lock a program state.

FIG. 28 is a circuit diagram illustrating the structure of a program register having a function to lock the program state.

Referring to FIG. 28, program register 300 is a unit for storing a one-bit program data signal, as described in FIG. 23. Program register 300 includes a current sense amplifier 110, a program cell PRC, and a comparative resistor portion 205. Comparative resistor portion 205 has fixed resistors 206, 207. The electric resistance of resistor 206 is equal to electric resistance Rmin of tunneling magneto-resistance element TMR, and the electric resistance of resistor 207 is equal to $\Delta R/2$. Therefore, electric resistance Rcp of the comparative resistor portion 205 is defined by Rcp=Rmin+$\Delta R/2$. Program cell PRC is formed from the same tunneling magneto-resistance element TMR as that of memory cell MC. Program cell PRC is connected between a node N0 and a power supply node 200. Power supply node 200 normally supplies ground voltage Vss.

Before the program state is not locked, the tunneling film of tunneling magneto-resistance element TMR in the program register has not been subjected to dielectric breakdown. Therefore, program cell PRC has either electric resistance Rmax or Rmin like tunneling magneto-resistance element TMR in each memory cell MC.

Figure 29A:
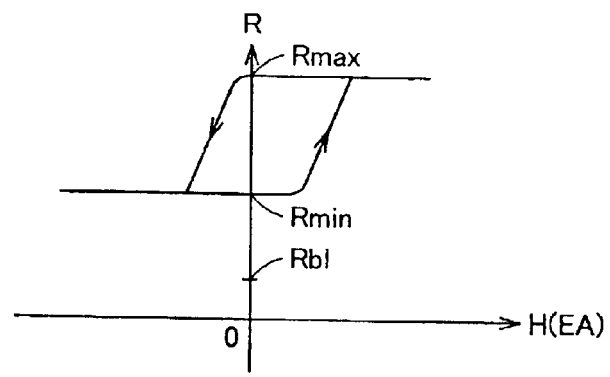
FIGS. 29A and 29B illustrate the electric resistance of a program cell before and after the program state is locked.

FIG. 29A shows characteristics of the electric resistance of program cell PRC before the program state is locked. Referring to FIG. 29A, the electric resistance of program cell PRC is inverted when a magnetic field exceeding a threshold value for inverting the magnetization direction of the free magnetic layer is applied in the easy-axis (EA) direction. As a result, the electric resistance of program cell PRC is set to either Rmax or Rmin. As described before in FIG. 12 and the like, data write operation to program cell PRC (inversion of the magnetization direction thereof) can be conducted by applying data write magnetic fields from both program word line PWL and program bit line PBL to program cell PRC.

Referring back to FIG. 28, it is herein assumed that the state where the fixed magnetic layer and the free magnetic layer in program cell PRC have the same magnetization direction is defined as the initial state. In this case, program cell PRC has an electric resistance Rmin in the initial state. Such definition of the initial state eliminates the need for a special magnetizing step for initializing program cell PRC.

As a result, in the initial state, the electric resistance of program cell PRC is lower than electric resistance Rcp of comparative resistor portion 205. Accordingly, node N1 is set to H level (power supply voltage Vcc1). If an L-level signal must be output from node N1 in order to store the program data in processes P110, P160 of FIG. 27, data is written to program cell PRC. As a result, the electric resistance thereof changes from Rmin to Rmax. Since the electric resistance of program cell PRC becomes higher than electric resistance Rcp of comparative resistor portion 205, an L-level signal is output from node N1.

At least one of the plurality of program cells PRC are retained in the initial state in process P160 of FIG. 27. For such a program cell, that is, program cell that should output an H-level signal from node N1, the program state is locked in order to prevent data from being written thereto later by accident. In order to lock the program state, node N0 may be set to ground voltage Vss and power supply node 200 may be set to a negative voltage $-\text{Vnn}$. Negative voltage $-\text{Vnn}$ is determined so that an electric field capable of causing dielectric breakdown of the tunneling film can be applied to the tunneling film. The electric resistance of program cell PRC subjected to dielectric breakdown of the tunneling film is fixed in an irreversible manner.

Figure 29B:
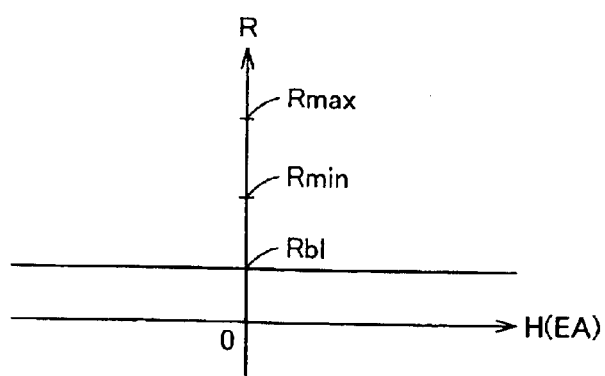

FIG. 29B shows characteristics of the electric resistance of program cell PRC after the program state is locked.

Referring to FIG. 29B, the electric resistance of the locked program cell PRC is fixed to Rb1 that is lower than Rmax and Rmin. If the program cell is locked and subjected to dielectric breakdown of the tunneling film, the electric resistance thereof will not change by magnetic data write operation, and a program signal generated on node N1 is fixed to H level.

Figure 30:
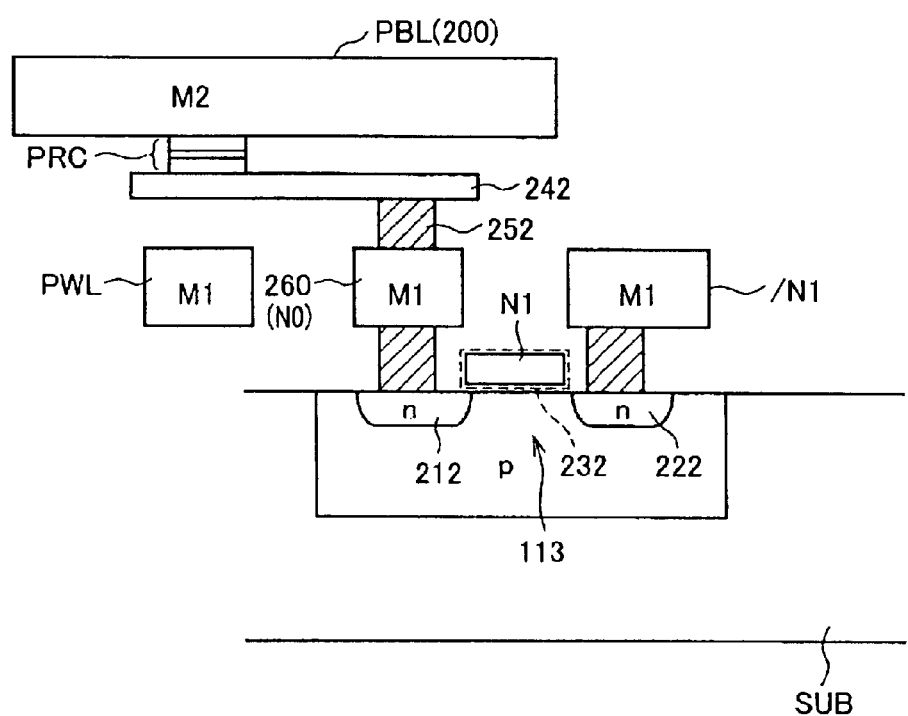
FIG. 30 illustrates a voltage applied in the operation of locking the program state.
Figure 31:
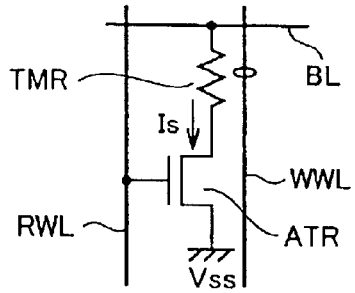
FIG. 31 schematically shows the structure of an MTJ memory cell.
Figure 32:
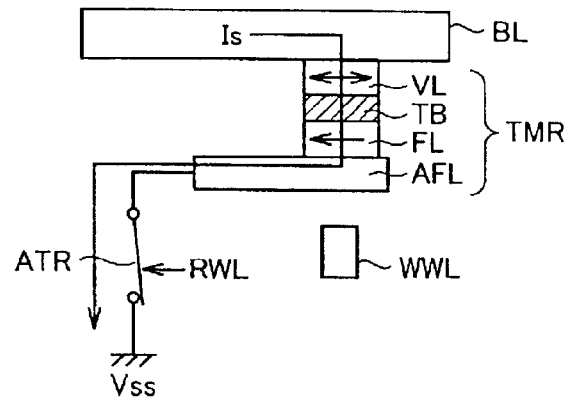
FIG. 32 is a conceptual diagram illustrating data read operation from the MTJ memory cell.
Figure 33:
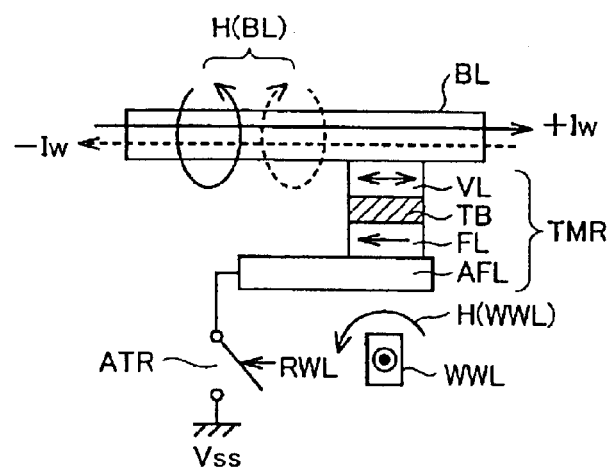
FIG. 33 is a conceptual diagram illustrating data write operation to the MTJ memory cell.
Figure 34:
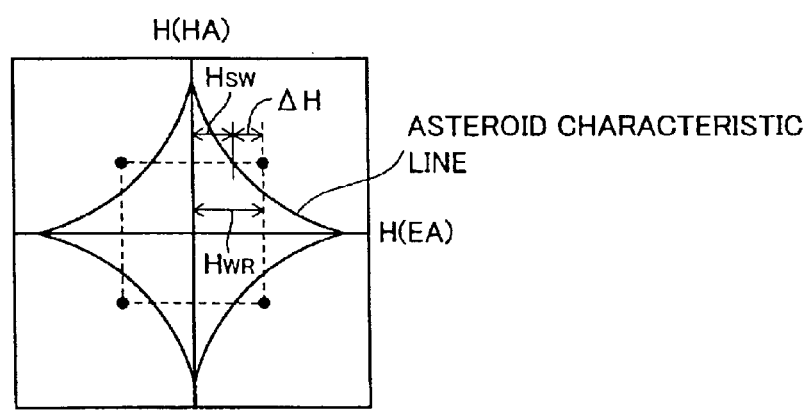
FIG. 34 is a conceptual diagram illustrating the relation between the data write current and the magnetization direction of a tunneling magneto-resistance element in data write operation to the MTJ memory cell.

FIG. 30 illustrates a voltage applied in the operation of locking the program state.

FIG. 30 is a cross-sectional view of program cell PRC in the same manner as that of FIG. 11B. Node N0, a connection node between transistor 113 and program cell PRC, corresponds to a metal wiring 260 formed in a metal wiring layer M1 coupled between source/drain region 212 and program cell PRC. Power supply node 200 corresponds to program bit line PBL. Therefore, in the locking operation, metal wiring 260 is connected to ground voltage Vss, and negative voltage −Vnn is supplied from a not-shown negative voltage generator to program bit line PBL.

In this way, in the locking operation, i.e., in the operation of causing dielectric breakdown of the tunneling film of the program cell, the polarity of the applied voltage is set in the same manner as that in the normal program data read operation. This ensures that a desired electric resistance is obtained after the locking operation.

Note that, in the structure of FIG. 28, the electric resistance of program cell PRC is fixed to a value smaller than Rmin and Rmax by blowing the tunneling film. However, the electric resistance of comparative resistor portion 205 may be fixed to a value higher or lower than Rmin and Rmax. For example, such a structure can be realized as follows: resistors 206, 207 of comparative resistor portion 205 are formed from MIS (Metal-Insulator Semiconductor) transistors or the like, and electric resistance Rcp of comparative resistor portion 205 is fixed to a value lower than Rmin (i.e., Rcp<Rmin) in an irreversible manner by causing breakdown of the insulating films of the MIS transistors with a high voltage. Alternatively, resistors 206, 207 may be formed from metal wirings, and electric resistance Rcp of comparative resistor portion 205 may be fixed to a value higher than Rmax (i.e., Rcp>Rmax) in an irreversible manner by blowing the metal wiring with a large current. Alternatively, a metal wiring capable of being blown with a large current may be inserted in series with program cell PRC so that the electric resistance of the locked program cell is fixed to a value higher than Rmax in an irreversible manner.

Note that, in the structures described in the first to seventh embodiments, the defective addresses for specifying defective memory cells are stored in program circuit 100 as program information. However, the present invention is not limited to this.

For example, prescribed currents Iw(Ref) and Ip(Ref) in FIG. 18, 19 for defining the amount of data write current and the internal power supply voltages may be tuned according to the program information stored in program circuit 100. In this way, the operation conditions of the internal circuitry of the MRAM device, the operation mode of the MRAM device and the like can be stored in the program circuit of the present invention as program information.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:
   a memory array having a plurality of memory cells arranged in a matrix, for magnetically storing data, wherein
   each of said memory cells has a magnetic storage portion for storing data when being magnetized in one of two directions,
   said thin film magnetic memory device further comprising:
   a program circuit for storing information for use in at least one of data read operation and data write operation from and to said plurality of memory cells, wherein
   said program circuit includes a plurality of program units for storing program data of said information when the program unit is in a program state,
   each of said program units includes two program cells that are magnetized in one of two directions, and
   when said program unit is in said program state, one of said two program cells in said program unit is magnetized in a direction different from that in a non-program state.

2. The thin film magnetic memory device according to claim 1, wherein
   each of said magnetic storage portions and each of said program cells have a same structure,
   when the program unit is in said non-program state, said two program cells in said program unit are magnetized in a same direction, and
   a magnetization direction of said magnetic storage portions in an initial state is the same as that of said program cells in said non-program state.

3. The thin film magnetic memory device according to claim 1, wherein
   the two magnetization directions of said magnetic storage portions and said program cells are respectively set along an easy axis specific to said magnetic storage portions and an easy axis specific to said program cells, and
   said magnetic storage portions and said program cells are arranged so that said respective easy axes thereof extend in a same direction.

4. The thin film magnetic memory device according to claim 1, wherein
   each of said magnetic storage portions and each of said program cells include
   a first magnetic layer magnetized in a fixed direction,
   a second magnetic layer magnetized either in a same direction as, or in an opposite direction to, that of said first magnetic layer depending on storage data, and
   an insulating film formed between said first and second magnetic layers, and
   in each of the program cells in said non-program state and each of the magnetic storage portions in said initial state, said first and second magnetic layers are magnetized in a same direction.

5. The thin film magnetic memory device according to claim 4, wherein a step of magnetizing said magnetic storage portions to said initial state and a step of said magnetizing each program cells to said non-program state are conducted simultaneously.

6. The thin film magnetic memory device according to claim 1, wherein
   said memory array further includes
   redundant circuits provided respectively corresponding to prescribed blocks of said plurality of memory cells, each for replacing the prescribed block including a defective memory cell, and
   said information stored in said program circuit includes a defective address for specifying the prescribed block including said defective memory cell, said thin film magnetic memory device further comprising:
a redundant control circuit for controlling access to said redundant circuits based on a comparison result between an address signal for selecting said prescribed blocks and said defective address stored in said program circuit.

7. The thin film magnetic memory device according to claim 6, wherein
when said defective address is selected by said address signal, said redundant control circuit provides an instruction to access said redundant circuits and an instruction to discontinue access to a prescribed block corresponding to said address signal.

8. The thin film magnetic memory device according to claim 6, further comprising:
a monitor terminal for outputting an electric signal according to said comparison result in said redundant control circuit.

9. The thin film magnetic memory device according to claim 1, wherein
each of said program cells has first and second electric resistances respectively corresponding to said two magnetization directions,
each of said program units further includes current sensing circuits provided respectively corresponding to said program cells,
in program data read operation from said program cells, each of said current sensing circuits applies a bias voltage to the corresponding program cell and outputs a binary voltage signal according to a current flowing through said corresponding program cell by said bias voltage,
each of said program units further includes a logic gate for outputting a first program signal, said first program signal indicating whether said program unit is in said program state or said non-program state according to a level of said binary voltage signal output from said current sensing circuits, and
each of said program units outputs one of said binary voltage signals respectively output from said current sensing circuits as a second program signal indicating a level of said program data.

10. The thin film magnetic memory device according to claim 9, wherein each of said current sensing circuits applies said bias voltage to both a reference resistor having an electric resistance equal to an intermediate value of said first and second electric resistances and the corresponding program cell, and amplifies a difference between currents flowing through said reference resistor and said corresponding program cell and outputs said binary voltage signal.

11. The thin film magnetic memory device according to claim 1, wherein a bias voltage applied to each of said program cells in program data read operation from said program cells is lower than a voltage applied to each of said magnetic storage portions in normal data read operation.

12. The thin film magnetic memory device according to claim 1, wherein a period during which a bias voltage is applied to each of said program cells in program data read operation from said program cells is shorter than that during which a voltage is applied to each magnetic storage portion in normal data read operation.

13. The thin film magnetic memory device according to claim 1, wherein
in program data read operation, each program unit outputs a first program signal and a second program signal according to the magnetization directions of corresponding two program cells, said first program signal indicating whether said program unit is in said program state or said non-program state, and said second program signal indicating a level of said program data,
said program circuit further includes data latch circuits provided respectively corresponding to said program units, for holding said first and second program signals output from corresponding one of said program units,
said program data read operation is conducted in response to power-ON of said thin film magnetic memory device, and
said data latch circuits hold said first and second program signals from power-ON until power-OFF of said thin film magnetic memory device.

14. The thin film magnetic memory device according to claim 1, wherein
when the program unit is in said non-program state, said program cells in said program unit are magnetized in a same direction,
each program cell is magnetized by a first program magnetic field of a hard-axis direction and a second program magnetic field of an easy-axis direction,
said program circuit further includes
a program selection line shared by said two program cells of a same program unit, for receiving a first program current for generating said first program magnetic field, and
first and second program data lines provided respectively corresponding to said two program cells, for receiving a second program current for generating said second program magnetic field, and
said second program current is applied to said first and second program data lines in opposite directions.

15. The thin film magnetic memory device according to claim 14, wherein
said program circuit further includes
a voltage setting portion for connecting one end of said first program data line to one of first and second voltages and connecting one end of said second program data line to the other voltage according to a level of said program data, and
a program data line connection portion for electrically coupling the other ends of said first and second program data lines at least in said program data write operation.

16. The thin film magnetic memory device according to claim 14, wherein
each of said magnetic storage portions is magnetized by a first data write magnetic field of a hard-axis direction a second data write magnetic field of an easy-axis direction, and
each of said magnetic storage portions and each of said program cells have a same structure and same magnetic characteristics,
said thin film magnetic memory device further comprising:
a plurality of write selection lines provided respectively corresponding to memory cell rows, for receiving a first data write current for generating said first data write magnetic field in a selected row;
a plurality of write data lines provided respectively corresponding to memory cell columns, for receiving a second data write current for generating said second data write magnetic field in a selected column; and a current supply circuit for supplying a prescribed current to a write selection line of said selected row as said first data write current, wherein said current supply circuit supplies said prescribed current to said program selection line as said first program current in said program data write operation.

17. The thin film magnetic memory device according to claim 14, wherein each of said magnetic storage portions is magnetized by a first data write magnetic field of a hard-axis direction a second data write magnetic field of an easy-axis direction, and said magnetic storage portions and said program cells have a same structure and same magnetic characteristics, said thin film magnetic memory device further comprising:

a plurality of write selection lines provided respectively corresponding to memory cell rows, for receiving a first data write current for generating said first data write magnetic field in a selected row;

a plurality of write data lines provided respectively corresponding to memory cell columns, for receiving a second data write current for generating said second data write magnetic field in a selected column; and a current supply circuit for supplying a prescribed current to a write data line of said selected column as said second data write current, said prescribed current having a direction according to write data, wherein said current supply circuit supplies said prescribed current to said program data lines as said second program current in said program data write operation.

18. The thin film magnetic memory device according to claim 1, wherein each of said program cells includes a plurality of series-connected magneto-resistance elements, and each of said magneto-resistance elements have a same structure and same magnetic characteristics as those of each of said magnetic storage portions.

19. A thin film magnetic memory device, comprising:

a memory array having a plurality of memory cells for magnetically storing data, wherein each of said memory cells has a magnetic storage portion for storing data when being magnetized in one of two directions, said thin film magnetic memory device further comprising:

a program circuit for storing information for use in operation of said thin film magnetic memory device, wherein said program circuit includes a program element for magnetically storing program data of said information, a sensing circuit for reading said program data from said program element in response to power-ON of said thin film magnetic memory device, and a data latch circuit for holding said program data read by said sensing circuit until power-OFF of said thin film magnetic memory device.

20. A thin film magnetic memory device, comprising:

a memory array having a plurality of memory cells each magnetically storing one-bit data, wherein each of said memory cells has a magneto-resistance element whose electric resistance varies when said magneto-resistance element is magnetized in a direction according to said data, said thin film magnetic memory device further comprising:

a plurality of program registers each storing a one-bit program signal for use in programming of information used in operation of said thin film magnetic memory device, wherein each program register includes a plurality of program elements each having an electric resistance varying according to a magnetization direction thereof, and a sensing circuit for reading a corresponding one-bit program signal according to a difference in electric resistance between said plurality of program elements, and the number of said program elements included in each of said program registers is greater than that of said magneto-resistance elements used in each of said memory cells to store one-bit data.

21. The thin film magnetic memory device according to claim 20, wherein each of said program elements and each of said magneto-resistance elements include a first magnetic layer magnetized in a fixed direction, a second magnetic layer magnetized either in a same direction as, or an opposite direction to, that of said first magnetic layer depending on said data and said program signal to be stored, respectively, and an insulating film formed between said first and second magnetic layers, wherein a difference between voltages applied to said first and second magnetic layers of each of said program elements upon reading said program signal is greater than that between voltages applied to said first and second magnetic layers of each of said magneto-resistance elements upon reading said data.

22. The thin film magnetic memory device according to claim 20, wherein each pair of program registers forms a program unit for storing one-bit program data, and said one-bit program signal stored in one program register of said pair of program registers indicates whether said program unit is in a non-program state or a program state.

23. A thin film magnetic memory device, comprising:

a memory array having a plurality of memory cells for magnetically storing data, wherein each of said memory cells includes a magneto-resistance element having either a first electric resistance or a second electric resistance higher than said first electric resistance when being magnetized in a direction according to said data, said thin film magnetic memory device further comprising:

a plurality of program registers each storing a one-bit program signal for use in programming of information used in operation of said thin film magnetic memory device, wherein each of said program registers includes a plurality of program elements each having an electric resistance varying according to a magnetization direction thereof, each of said program elements has either a third electric resistance lower than said first electric resistance or a fourth electric resistance higher than said third electric resistance according to said one-bit program signal stored therein, and a ratio between said first and second electric resistances is equal to that between said third and fourth electric resistances.

24. The thin film magnetic memory device according to claim 23, wherein each of said program elements and each of said magneto-resistance elements includes a first magnetic layer magnetized in a fixed direction, a second magnetic layer magnetized either in a same direction as, or an opposite direction to, that of said first magnetic layer depending on said data and said program signal to be stored, and an insulating film formed between said first and second magnetic layers, wherein a current passage area in said first and second magnetic layers and said insulating layer upon reading said program signal from each of said program elements is greater than that in said first and second magnetic layers and said insulating layer upon reading said data from each of said magneto-resistance elements.

* * * * *

UNITED STATES PATENT AND TRADEMARK OFFICE
CERTIFICATE OF CORRECTION

| | |
|---|---|
| PATENT NO. | : 6,987,690 B2 |
| APPLICATION NO. | : 10/691513 |
| DATED | : June 17, 2006 |
| INVENTOR(S) | : Hideto Hidaka |

It is certified that error appears in the above-identified patent and that said Letters Patent is hereby corrected as shown below:

One the title page of the Letters Patent,

Item (56) References Cited, U.S. PATENT DOCUMENTS, add --5,907,514 * 5/1999 Lee et al. --

Item (56) References Cited, FOREIGN PATENT DOCUMENTS, add,
-- WO 99/53499 10/1999 --
-- EP 1 132 924 A2 10/2000 --
-- EP 1 253 651 A2 10/2002 --

Item (56) References Cited, OTHER PUBLICATIONS,

Change " Durlam, M., et al. "Nonvolatile RAM based on magnetic tunnel junction elements" IEEE International Solid-State Circuits Conference, February -9, 2000, pp 130-131. " to -- Durlam, M., et al. "Nonvolatile RAM based on magnetic tunnel junction elements" IEEE International Solid-State Circuits Conference,
February 7-9, 2000, pp 130-131. --

Change " Scheuerlein, R., et al. "A 10ns read and write non-volatile memory array using a magnetic tunhnel junction and FET switch in each cell" IEEE International Solid-State Circuits Conference, February 7-9, 2000, pp 128-129. " to -- Scheuerlein, R., et al. "A 10ns read and write non-volatile memory array using a magnetic tunnel junction and FET switch in each cell" IEEE International Solid-State Circuits Conference, February 7-9, 2000, pp 128-129. --

Item (57) ABSTRACT, change "24 Claims," to --35 Claims, --

UNITED STATES PATENT AND TRADEMARK OFFICE
CERTIFICATE OF CORRECTION

PATENT NO.          : 6,987,690 B2
APPLICATION NO. : 10/691513
DATED                   : June 17, 2006
INVENTOR(S)         : Hideto Hidaka It is certified that error appears in the above-identified patent and that said Letters Patent is hereby corrected as shown below:

Col. 43 - Line 1-12
    Under "What is claimed is:", add claim 34 – 44 as followed:

34. (Previously Presented) A thin film magnetic memory device, comprising:

a memory array having a plurality of memory cells arranged in a matrix, for magnetically storing data, wherein each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and a magnetization direction of each said magnetic storage portion in an initial state is the same as that of each said program cell in a non-program state.

UNITED STATES PATENT AND TRADEMARK OFFICE
CERTIFICATE OF CORRECTION

PATENT NO. : 6,987,690 B2
APPLICATION NO. : 10/691513
DATED : June 17, 2006
INVENTOR(S) : Hideto Hidaka It is certified that error appears in the above-identified patent and that said Letters Patent is hereby corrected as shown below:

Col. 44 Line 13-26
    Under "What is claimed is:", add 35. (Previously Presented) A thin film magnetic memory device, comprising:

a memory array having a plurality of memory cells arranged in a matrix, for magnetically storing data, wherein each of said memory cells has a magnetic storage portion for storing data which being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein the magnetization directions of each said magnetic storage portion and each said program cell are respectively set along an easy axis specific to said program cell, and said magnetic storage portion and said program cell are arranged so that said respective easy axis thereof extend in a same direction.

UNITED STATES PATENT AND TRADEMARK OFFICE
CERTIFICATE OF CORRECTION

| | |
|---|---|
| PATENT NO. | : 6,987,690 B2 |
| APPLICATION NO. | : 10/691513 |
| DATED | : June 17, 2006 |
| INVENTOR(S) | : Hideto Hidaka |

It is certified that error appears in the above-identified patent and that said Letters Patent is hereby corrected as shown below:

Col. 44 Line 26-43
    Under "What is claimed is:", add 36. (Previously Presented) A thin film magnetic memory device, comprising:

a memory array having a plurality of memory cells arranged in a matrix, for magnetically storing data, wherein each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein each said magnetic storage portion and each said program cell include a first magnetic layer magnetized in a fixed direction, a second magnetic layer magnetized either in a same direction as, or in an opposite direction to, that of said first magnetic layer depending on storage data, and an insulating film formed between said first and second magnetic layers, and in each said program cell in said non program state and each said magnetic storage portion in said initial state, said first and second magnetic layers are magnetized in a same direction.

Col. 44 Line 43-46
    Under "What is claimed is:", add 37. (Previously Presented) The thin film magnetic memory device according to claim 36, wherein a step of magnetizing said magnetic storage portions to said initial state and a step of said magnetizing each program cells to said non-program state are conducted simultaneously.

UNITED STATES PATENT AND TRADEMARK OFFICE
CERTIFICATE OF CORRECTION

PATENT NO.        : 6,987,690 B2
APPLICATION NO. : 10/691513
DATED             : June 17, 2006
INVENTOR(S)       : Hideto Hidaka It is certified that error appears in the above-identified patent and that said Letters Patent is hereby corrected as shown below:

Col. 44 Line 47-65
    Under "What is claimed is:", add 38. (Previously Presented) A thin film magnetic memory device, comprising: a memory array having a plurality of memory cells arranged in a matrix, for magnetically storing data, wherein each of said memory cells has a magnetic storage portion for storing data when being magnetized in one of two directions, said thin film magnetic memory device father comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein said memory array further includes redundant circuits provided respectively corresponding to prescribed blocks of said plurality of memory cells, each for replacing the prescribed block including a defective memory cell, and said information stored in said program circuit includes a defective address for specifying the prescribed block including said defective memory cell, said thin film magnetic memory device further comprising:

a redundant control circuit for controlling access to said redundant circuits based on a comparison result between an address signal for selecting said prescribed blocks and said defective address stored in said program circuit.

UNITED STATES PATENT AND TRADEMARK OFFICE
CERTIFICATE OF CORRECTION

PATENT NO.       : 6,987,690 B2
APPLICATION NO.  : 10/691513
DATED            : June 17, 2006
INVENTOR(S)      : Hideto Hidaka It is certified that error appears in the above-identified patent and that said Letters Patent is hereby corrected as shown below:

Col. 45 Line 1-3
    Under "What is claimed is:", add 39. (Previously Presented) The thin film magnetic memory device according to claim 38, wherein.

when said defective address is selected by said address signal, said redundant control circuit provides an instruction to access said redundant circuits and an instruction to discontinue access to a prescribed block corresponding to said address signal.

Col. 45 Line 4-6

40. (Previously Presented) The thin film magnetic memory device according to claim 38, further comprising:

a monitor terminal for outputting an electric signal according to said comparison result in said redundant control circuit.

Col. 45 Line 7-12

41. (Previously Presented) A thin film magnetic memory device, comprising: a memory array having a plurality of memory cells arranged in a matrix, for magnetically storing data, wherein each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein a bias voltage applied to each said program cell in program data read operation from said program cell is lower than a voltage applied to each said magnetic storage portion in normal data read operation.

UNITED STATES PATENT AND TRADEMARK OFFICE
CERTIFICATE OF CORRECTION

PATENT NO. : 6,987,690 B2
APPLICATION NO. : 10/691513
DATED : June 17, 2006
INVENTOR(S) : Hideto Hidaka It is certified that error appears in the above-identified patent and that said Letters Patent is hereby corrected as shown below:

Col. 45 Line 13-25
Under "What is claimed is:", add 42. (Previously Presented) A thin film magnetic memory device, comprising:

a memory array having a plurality of memory cells arranged in a matrix, for magnetically storing data, wherein each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein a period during which a bias voltage is applied to each said program cell in program data read operation from said program cell is shorter than that during which a voltage is applied to each said magnetic storage portion in normal data read operation.

UNITED STATES PATENT AND TRADEMARK OFFICE
CERTIFICATE OF CORRECTION

PATENT NO. : 6,987,690 B2
APPLICATION NO. : 10/691513
DATED : June 17, 2006
INVENTOR(S) : Hideto Hidaka It is certified that error appears in the above-identified patent and that said Letters Patent is hereby corrected as shown below:

Col. 45 Line 26-38
Under "What is claimed is:", add 43. (Previously Presented) A thin film magnetic memory device, comprising:

a memory array having a plurality of memory cells arranged in a matrix, for magnetically storing data, wherein each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein a voltage supplied to each said program cell in program data operation by a physical breakdown operation is higher than a voltage applied to each said magnetic storage portion in normal data read operation.

UNITED STATES PATENT AND TRADEMARK OFFICE
CERTIFICATE OF CORRECTION

PATENT NO. : 6,987,690 B2
APPLICATION NO. : 10/691513
DATED : June 17, 2006
INVENTOR(S) : Hideto Hidaka It is certified that error appears in the above-identified patent and that said Letters Patent is hereby corrected as shown below:

Col. 45 Line 38-48
Under "What is claimed is:", add 44. (New) A semiconductor memory device, comprising:

a first memory including normal memory cells for storing data therein;

an address decoder coupled to said first memory and selecting the normal memory cells according to the address provided to the semiconductor memory device; and a redundant controller coupled to said address decoder and including a second memory for storing addresses of the defective normal memory cells of said first memory, wherein said second memory has a magneto-resistance element;

said semiconductor memory device further comprises a third memory including spare memory cells for repairing the defective normal memory cells; and a redundant address decoder coupled to said redundant controller and said third memory, and selecting the spare memory cells according to the address stored in said second memory.

Signed and Sealed this

Twentieth Day of February, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,987,690 B2 |
| APPLICATION NO. | : 10/691513 |
| DATED | : January 17, 2006 |
| INVENTOR(S) | : Hideto Hidaka |

It is certified that error appears in the above-identified patent and that said Letters Patent is hereby corrected as shown below:

Under "What is claimed is:", add (old claims 34 – 44) re-numbered claims 25 – 35 as followed:

Col. 43 Line 1-12

25. A thin film magnetic memory device, comprising:

a memory array having a plurality of memory cells arranged in a matrix, for magnetically storing data, wherein each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and a magnetization direction of each said magnetic storage portion in an initial state is the same as that of each said program cell in a non-program state.

Under "What is claimed is:", add

Col. 44 Line 13-26

26. A thin film magnetic memory device, comprising:

a memory array having a plurality of memory cells arranged in a matrix, for magnetically storing data, wherein each of said memory cells has a magnetic storage portion for storing

UNITED STATES PATENT AND TRADEMARK OFFICE
CERTIFICATE OF CORRECTION

PATENT NO. : 6,987,690 B2
APPLICATION NO. : 10/691513
DATED : January 17, 2006
INVENTOR(S) : Hideto Hidaka It is certified that error appears in the above-identified patent and that said Letters Patent is hereby corrected as shown below:

Col. 44 Line 13-26 (cont'd)

data when being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein the magnetization directions of each said magnetic storage portion and each said program cell are respectively set along an easy axis specific to said program cell, and said magnetic storage portion and said program cell are arranged so that said respective easy axis thereof extend in a same direction.

Under "What is claimed is:", add

Col. 44 Line 26-43

27. A thin film magnetic memory device, comprising:

a memory array having a plurality of memory cells arranged in a matrix, for magnetically storing data, wherein each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein

UNITED STATES PATENT AND TRADEMARK OFFICE
CERTIFICATE OF CORRECTION

| | |
|---|---|
| PATENT NO. | : 6,987,690 B2 |
| APPLICATION NO. | : 10/691513 |
| DATED | : January 17, 2006 |
| INVENTOR(S) | : Hideto Hidaka |

It is certified that error appears in the above-identified patent and that said Letters Patent is hereby corrected as shown below:

Col. 44 Line 26-43 (cont'd)

said program circuit includes a plurality of program units for storing program data of said information when the program unit is in a program state, each of said program units includes at least one program cell that is magnetized for data writing, and wherein each said magnetic storage portion and each said program cell include a first magnetic layer magnetized in a fixed direction, a second magnetic layer magnetized either in a same direction as, or in an opposite direction to, that of said first magnetic layer depending on storage data, and an insulating film formed between said first and second magnetic layers, and in each said program cell in said non program state and each said magnetic storage portion in said initial state, said first and second magnetic layers are magnetized in a same direction.

Under "What is claimed is:", add

Col. 44 Line 43-46

28. The thin film magnetic memory device according to claim 36, wherein a step of magnetizing said magnetic storage portions to said initial state and a step of said magnetizing each program cells to said non-program state are conducted simultaneously.

Col. 44 Line 47-65

29. A thin film magnetic memory device, comprising: a memory array having a plurality of memory cells arranged in a matrix, for magnetically storing data, wherein each of said memory cells has a magnetic storage portion for storing data when being magnetized in one of two directions,

UNITED STATES PATENT AND TRADEMARK OFFICE
CERTIFICATE OF CORRECTION

PATENT NO. : 6,987,690 B2
APPLICATION NO. : 10/691513
DATED : January 17, 2006
INVENTOR(S) : Hideto Hidaka It is certified that error appears in the above-identified patent and that said Letters Patent is hereby corrected as shown below:

Col. 44 Line 47-65 (cont'd)

said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein said memory array further includes redundant circuits provided respectively corresponding to prescribed blocks of said plurality of memory cells, each for replacing the prescribed block including a defective memory cell, and said information stored in said program circuit includes a defective address for specifying the prescribed block including said defective memory cell, said thin film magnetic memory device further comprising:

a redundant control circuit for controlling access to said redundant circuits based on a comparison result between an address signal for selecting said prescribed blocks and said defective address stored in said program circuit.

Under "What is claimed is:", add

Col. 45 Line 1-3

30. The thin film magnetic memory device according to claim 38, wherein when said defective address is selected by said address signal, said redundant control circuit provides an instruction to access said redundant circuits and an instruction to discontinue access to a prescribed block corresponding to said address signal.

UNITED STATES PATENT AND TRADEMARK OFFICE
CERTIFICATE OF CORRECTION

PATENT NO. : 6,987,690 B2
APPLICATION NO. : 10/691513
DATED : January 17, 2006
INVENTOR(S) : Hideto Hidaka It is certified that error appears in the above-identified patent and that said Letters Patent is hereby corrected as shown below:

Col. 45 Line 4-6

31. The thin film magnetic memory device according to claim 38, further comprising:

a monitor terminal for outputting an electric signal according to said comparison result in said redundant control circuit.

Col. 45 Line 7-12

32. A thin film magnetic memory device, comprising: a memory array having a plurality of memory cells arranged in a matrix, for magnetically storing data, wherein each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein a bias voltage applied to each said program cell in program data read operation from said program cell is lower than a voltage applied to each said magnetic storage portion in normal data read operation.

Under "What is claimed is:", add

Col. 45 Line 13-25

33. A thin film magnetic memory device, comprising:

a memory array having a plurality of memory cells arranged in a matrix, for magnetically storing data, wherein

UNITED STATES PATENT AND TRADEMARK OFFICE
CERTIFICATE OF CORRECTION

| | | |
|---|---|---|
| PATENT NO. | : 6,987,690 B2 | Page 6 of 8 |
| APPLICATION NO. | : 10/691513 | |
| DATED | : January 17, 2006 | |
| INVENTOR(S) | : Hideto Hidaka | |

It is certified that error appears in the above-identified patent and that said Letters Patent is hereby corrected as shown below:

Col. 45 Line 13-25(cont'd)

each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein said program circuit includes a plurality of program units for storing program data of said information when the program unit is in a program state, each of said program units includes at least one program cell that is magnetized for data writing, and wherein a period during which a bias voltage is applied to each said program cell in program data read operation from said program cell is shorter than that during which a voltage is applied to each said magnetic storage portion in normal data read operation.

Under "What is claimed is:", add

Col. 45 Line 26-38

34. A thin film magnetic memory device, comprising:

a memory array having a plurality of memory cells arranged in a matrix, for magnetically storing data, wherein each of said memory cells has a magnetic storage portion for storing data when being magnetized in one of two directions, said thin film magnetic memory device further comprising:

a program circuit for storing information for use in at least one of data read operation and data write operation from and to said plurality of memory cells, wherein

UNITED STATES PATENT AND TRADEMARK OFFICE
CERTIFICATE OF CORRECTION

| | | |
|---|---|---|
| PATENT NO. | : 6,987,690 B2 | |
| APPLICATION NO. | : 10/691513 | |
| DATED | : January 17, 2006 | |
| INVENTOR(S) | : Hideto Hidaka | |

It is certified that error appears in the above-identified patent and that said Letters Patent is hereby corrected as shown below:

Col. 45 Line 26-38 (cont'd)

said program circuit includes a plurality of program units for storing program data of said information when the program unit is in a program state, storage portion in normal data read operation.

each of said program units includes at least one program cell that is magnetized for data writing, and wherein a voltage supplied to each said program cell in program data operation by a physical breakdown operation is higher than a voltage applied to each said magnetic storage portion in normal data read operation.

Under "What is claimed is:", add

Col. 45 Line 38-48

35. A semiconductor memory device, comprising:

a first memory including normal memory cells for storing data therein;

an address decoder coupled to said first memory and selecting the normal memory cells according to the address provided to the semiconductor memory device; and a redundant controller coupled to said address decoder and including a second memory for storing addresses of the defective normal memory cells of said first memory, wherein said second memory has a magneto-resistance element;

said semiconductor memory device further comprises a third memory including spare memory cells for repairing the defective normal memory cells; and

UNITED STATES PATENT AND TRADEMARK OFFICE
CERTIFICATE OF CORRECTION

PATENT NO. : 6,987,690 B2
APPLICATION NO. : 10/691513
DATED : January 17, 2006
INVENTOR(S) : Hideto Hidaka It is certified that error appears in the above-identified patent and that said Letters Patent is hereby corrected as shown below:

Col. 45 Line 38-48 (cont'd)

a redundant address decoder coupled to said redundant controller and said third memory, and selecting the spare memory cells according to the address stored in said second memory.

Signed and Sealed this

Thirty-first Day of July, 2007

JON W. DUDAS
*Director of the United States Patent and Trademark Office*